(12) United States Patent
You et al.

(10) Patent No.: US 12,068,302 B2
(45) Date of Patent: Aug. 20, 2024

(54) SEMICONDUCTOR PACKAGE

(71) Applicant: Samsung Electronics Co., Ltd., Suwon-si (KR)

(72) Inventors: Seho You, Seoul (KR); Kyounglim Suk, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/301,420

(22) Filed: Apr. 17, 2023

(65) Prior Publication Data

US 2023/0253392 A1 Aug. 10, 2023

Related U.S. Application Data

(63) Continuation of application No. 17/190,689, filed on Mar. 3, 2021, now Pat. No. 11,670,629.

(30) Foreign Application Priority Data

Aug. 3, 2020 (KR) .................. 10-2020-0096946

(51) Int. Cl.
*H01L 23/538* (2006.01)
*H01L 23/00* (2006.01)
(Continued)

(52) U.S. Cl.
CPC .......... *H01L 25/18* (2013.01); *H01L 23/3128* (2013.01); *H01L 23/481* (2013.01);
(Continued)

(58) Field of Classification Search
CPC ............................. H01L 23/66; H01L 23/5389
See application file for complete search history.

(56) References Cited

U.S. PATENT DOCUMENTS 5,269,880 A 12/1993 Jolly et al.
8,648,454 B2 2/2014 Liu et al.
(Continued)

FOREIGN PATENT DOCUMENTS

JP 6609299 B2 11/2019

OTHER PUBLICATIONS

Chung-Hao Tsai, et al., "Array Antenna Integrated Fan-out Wafer Level Packaging (InFO-WLP) for Millimeter Wave System Applications," 2013 IEEE International Electron Devices Meeting, Dec. 9-11, 2013.
(Continued)

*Primary Examiner* — Evan G Clinton
(74) *Attorney, Agent, or Firm* — Harness, Dickey & Pierce, P.L.C.

(57) ABSTRACT

A semiconductor package is provided. The semiconductor package comprising a first redistribution structure comprising a first redistribution pattern; a first semiconductor chip on the first redistribution structure, the first semiconductor chip comprising a semiconductor substrate comprising a first surface and a second surface, a first back end of line (BEOL) structure on the first surface of the semiconductor substrate and comprising a first interconnect pattern, and a second BEOL structure on the second surface of the semiconductor substrate and comprising a second interconnect pattern; a molding layer covering a sidewall of the first semiconductor chip; a second redistribution structure on the first semiconductor chip and the molding layer and comprising a second redistribution pattern electrically connected to the second interconnect pattern.

20 Claims, 22 Drawing Sheets

(51) Int. Cl.
  *H01L 23/31* (2006.01)
  *H01L 23/48* (2006.01)
  *H01L 23/498* (2006.01)
  *H01L 23/522* (2006.01)
  *H01L 23/66* (2006.01)
  *H01L 25/18* (2023.01)

(52) U.S. Cl.
  CPC .. *H01L 23/49811* (2013.01); *H01L 23/49822* (2013.01); *H01L 23/5226* (2013.01); *H01L 23/5389* (2013.01); *H01L 23/66* (2013.01); *H01L 24/20* (2013.01); *H01L 24/16* (2013.01); *H01L 2223/6677* (2013.01); *H01L 2224/16227* (2013.01)

(56) References Cited

U.S. PATENT DOCUMENTS

| | | | |
|---|---|---|---|
| 9,196,951 | B2 | 11/2015 | Baks et al. |
| 9,337,526 | B2 | 5/2016 | Hong et al. |
| 10,636,713 | B2 | 4/2020 | Chiang et al. |
| 10,636,739 | B2 | 4/2020 | Beyne et al. |
| 2015/0084194 | A1* | 3/2015 | Molzer ................ H01L 23/481 257/774 |
| 2017/0141058 | A1* | 5/2017 | Lee ..................... H01L 23/481 |
| 2018/0053743 | A1 | 2/2018 | Melville et al. |
| 2018/0226349 | A1* | 8/2018 | Yu ...................... H01L 21/568 |
| 2019/0221531 | A1 | 7/2019 | Meyer et al. |
| 2019/0252792 | A1* | 8/2019 | Maruthamuthu ..... H01L 23/528 |
| 2019/0333880 | A1 | 10/2019 | Chen et al. |
| 2019/0355680 | A1* | 11/2019 | Chuang ............... H01L 23/5389 |
| 2019/0386378 | A1* | 12/2019 | Lee ................... H01L 23/49838 |
| 2020/0006242 | A1 | 1/2020 | Jee et al. |
| 2020/0118938 | A1 | 4/2020 | Wang et al. |
| 2020/0144165 | A1 | 5/2020 | Park et al. |
| 2021/0384134 | A1 | 12/2021 | Liu |
| 2022/0020735 | A1 | 1/2022 | Song et al. |

OTHER PUBLICATIONS

Non-Final Office Action issued Jul. 6, 2022 in U.S. Appl. No. 17/190,689.
Final Office Action issued Oct. 14, 2022 in U.S. Appl. No. 17/190,689.
Notice of Allowance issued Feb. 1, 2023 in U.S. Appl. No. 17/190,689.

\* cited by examiner

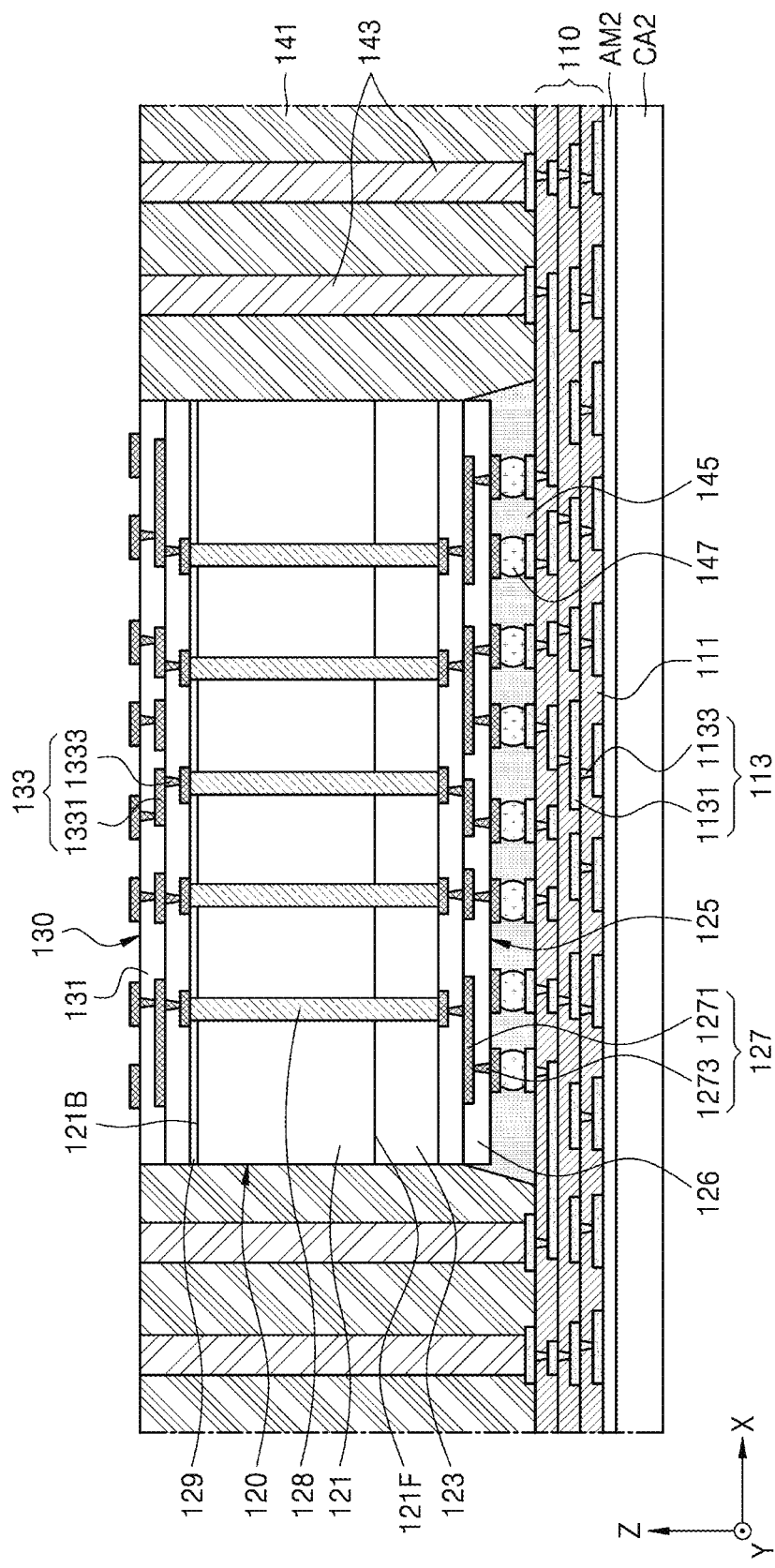

SEMICONDUCTOR PACKAGE

CROSS-REFERENCE TO RELATED APPLICATIONS

This application is a continuation of U.S. patent application Ser. No. 17/190,689, filed on Mar. 3, 2021, which is based on and claims priority under 35 U.S.C. § 119 to Korean Patent Application No. 10-2020-0096946, filed on Aug. 3, 2020, in the Korean Intellectual Property Office, the disclosures of each of which are incorporated by reference herein in their entirety.

BACKGROUND

The inventive concepts relate to a semiconductor package.

Recently, the demand for portable devices has sharply increased in the electronic products market, and accordingly, a demand for small and/or lightweight electronic components to be mounted on electronic products has been continuous. For electronic components to be small and lightweight, a demand for semiconductor packages to be mounted on the electronic components configured to process a large capacity of data with a small volume has also increased. Recently, a wafer level package technique and a panel level package technique of performing a semiconductor packaging process in a wafer level (or a panel level) and separating a wafer-level (or panel-level) semiconductor structure having passed through the semiconductor packaging process into individual packages have been proposed.

SUMMARY

The inventive concepts provide a semiconductor package.

According to an aspect of the inventive concepts, there is provided a semiconductor package including: a first redistribution structure including a first redistribution pattern; a first semiconductor chip including a semiconductor substrate on the first redistribution structure, a first back end of line (BEOL) structure on a first surface of the semiconductor substrate and including a first interconnect pattern, and a second BEOL structure on a second surface of the semiconductor substrate and including a second interconnect pattern; a molding layer on the first redistribution structure and covering a sidewall of the first semiconductor chip; a second redistribution structure on the first semiconductor chip and the molding layer, the second redistribution structure including a second redistribution pattern electrically connected to the second interconnect pattern of the second BEOL structure; and a conductive post passing through the molding layer and electrically connecting the first redistribution pattern to the second redistribution pattern, wherein a footprint of the second BEOL structure is the same as a footprint of the first semiconductor chip and smaller than a footprint of the second redistribution structure.

According to another aspect of the inventive concept, there is provided a semiconductor package including: a first redistribution structure including a first redistribution pattern; and a semiconductor chip on the first redistribution structure The semiconductor chip includes a semiconductor substrate; a first back end of line (BEOL) structure on a first surface of the semiconductor substrate, the first BEOL structure including a first interconnect pattern; a second BEOL structure on a second surface of the semiconductor substrate, the second BEOL structure including a second interconnect pattern and a first antenna pattern configured to transmit and receive a radio signal; and a through electrode passing through the semiconductor substrate and electrically connecting the first redistribution pattern to a second redistribution pattern.

According to another aspect of the inventive concept, there is provided a semiconductor package including: a first redistribution structure including a plurality of stacked first interlayer insulating layers, a first conductive line pattern on at least one of an upper or lower surface of the plurality of first interlayer insulating layers, and a first conductive via pattern connected to the first conductive line pattern and passing through at least one of the plurality of first interlayer insulating layers; a first semiconductor chip including a semiconductor substrate on the first redistribution structure, a first back end of line (BEOL) structure on a first surface of the semiconductor substrate and including a first interconnect pattern, and a second BEOL structure on a second surface of the semiconductor substrate and including a second interconnect pattern; a chip connection bump between the first semiconductor chip and the first redistribution structure; a molding layer on the first redistribution structure and covering a sidewall of the first semiconductor chip; and a second redistribution structure on the first semiconductor chip and the molding layer, the second redistribution structure including a plurality of stacked second interlayer insulating layers, a second conductive line pattern on at least one of an upper or lower surface of the plurality of second interlayer insulating layers, and a second conductive via pattern connected to the second conductive line pattern and passing through at least one of the plurality of second interlayer insulating layers, wherein a width of a footprint of the second BEOL structure in a first direction parallel to the second surface of the semiconductor substrate is the same as a width of a footprint of the first semiconductor chip in the first direction, and the width of the footprint of the second BEOL structure in the first direction is less than a width of a footprint of the second redistribution structure in the first direction.

BRIEF DESCRIPTION OF THE DRAWINGS

Some example embodiments of the inventive concepts will be more clearly understood from the following detailed description taken in conjunction with the accompanying drawings in which:

FIGS. 12A to 12E are cross-sectional views for describing a method of manufacturing a semiconductor package, according to some example embodiments of the inventive concepts.

DETAILED DESCRIPTION OF THE EMBODIMENTS

Figure 1:
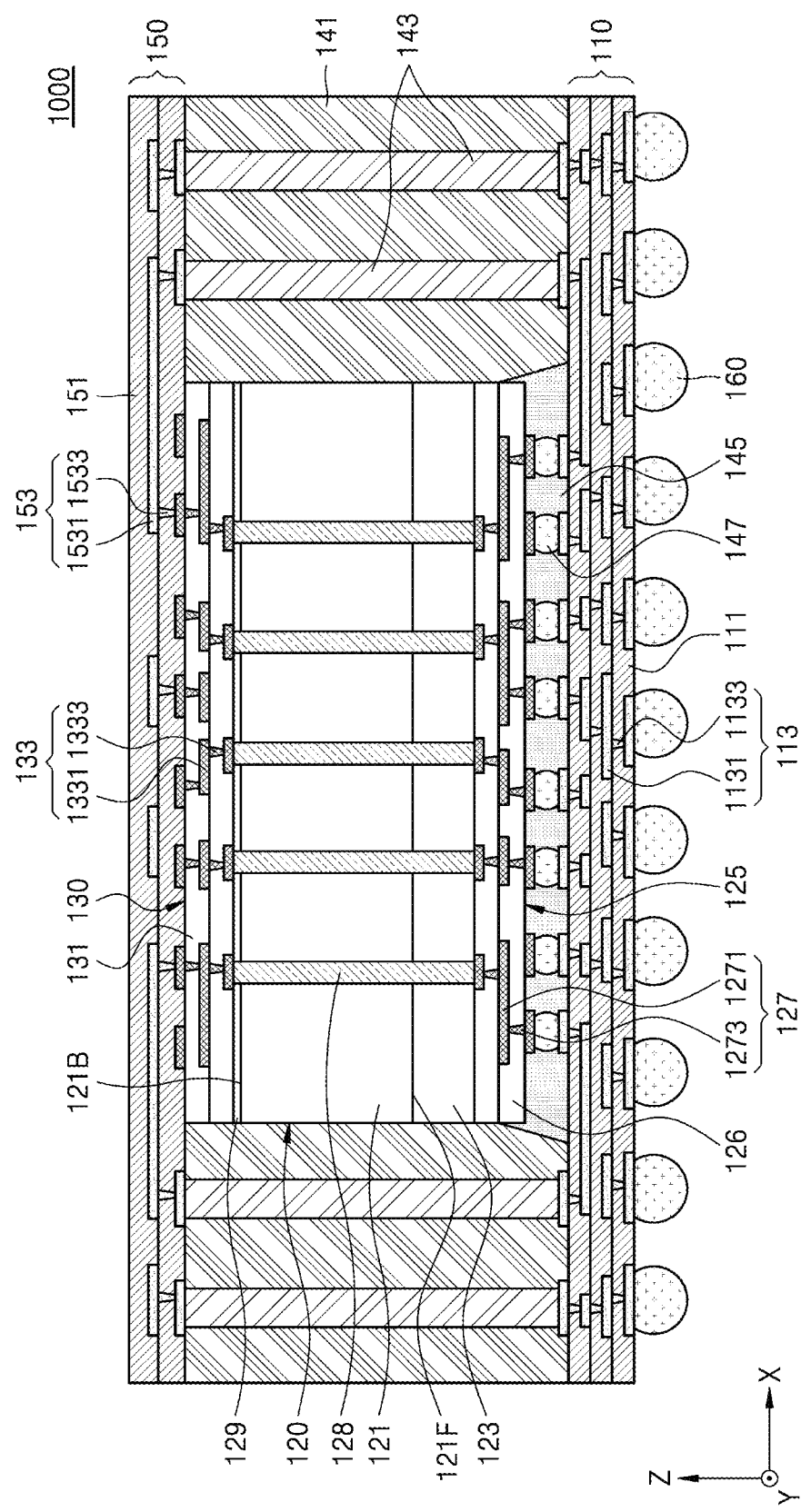
FIG. 1 is a cross-sectional view of a semiconductor package according to some example embodiments of the inventive concepts.

Hereinafter, example embodiments of the inventive concepts will be described in detail with reference to the accompanying drawings. Like reference numerals in the drawings denote like elements, and thus their repetitive description will be omitted.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

When the term "about" is used in this specification in connection with a numerical value, it is intended that the associated numerical value includes a manufacturing tolerance (e.g., ±10%) around the stated numerical value. Moreover, when the term "generally" is used in connection with geometric shapes, it is intended that precision of the geometric shape is not required but that latitude for the shape is within the scope of the disclosure. Further, regardless of whether numerical values or shapes are modified as "about" or "generally," it will be understood that these values and shapes should be construed as including a manufacturing or operational tolerance (e.g., ±10%) around the stated numerical values or shapes.

FIG. 1 is a cross-sectional view of a semiconductor package 1000 according to some example embodiments of the inventive concepts.

Referring to FIG. 1, the semiconductor package 1000 may include a first redistribution structure 110, a first semiconductor chip 120, a molding layer 141, a conductive post 143, and a second redistribution structure 150.

The semiconductor package 1000 may be a fan-out semiconductor package in which a footprint of the first redistribution structure 110 is greater than a footprint of the first semiconductor chip 120. For example, a horizontal width and/or a horizontal area of the first redistribution structure 110 may be greater than a respective horizontal width and/or a horizontal area of the first semiconductor chip 120.

The first redistribution structure 110 may include a first redistribution pattern 113 and a plurality of first redistribution insulating layers 111 covering the first redistribution pattern 113.

The plurality of first redistribution insulating layers 111 may be stacked on one another in a vertical direction (e.g., a Z-axis direction). The plurality of first redistribution insulating layers 111 may include a material layer including an organic compound such as a non-conductive film (NCF). For example, each of the plurality of first redistribution insulating layers 111 may include at least one of a photo imageable dielectric (PID), a thermoset molding film such as an Ajinomoto build-up film (ABF), and/or a photosensitive polyimide (PSPI).

The first redistribution pattern 113 may include a plurality of first redistribution line patterns 1131 on at least one of an upper and/or lower surface of the plurality of first redistribution insulating layers 111, and a plurality of first redistribution via patterns 1133 extending through at least one of the plurality of first redistribution insulating layers 111. The plurality of first redistribution via patterns 1133 may electrically connect the first redistribution line patterns 1131 on different levels in the vertical direction (e.g., the Z-axis direction). The first redistribution pattern 113 may include a conductive material, such as a metal. For example, the first redistribution pattern 113 may include at least one of copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), and/or an alloy thereof.

Some of the plurality of first redistribution line patterns 1131 may be on an upper surface of the first redistribution structure 110 to form bump pads respectively connected to chip connection bumps 147 attached to the first semiconductor chip 120 and form connection pads respectively connected to the conductive posts 143. In addition, some of the plurality of first redistribution line patterns 1131 may be on a lower surface of the first redistribution structure 110 to form external connection pads respectively connected to external connection terminals 160. The chip connection bumps 147 and/or the external connection terminal 160 may include, for example, a solder ball or a solder bump. For example, the chip connection bumps 147 and the external connection terminal 160 may include a conductive material, for example, at least one metal selected from tin (Sn), lead (Pb), nickel (Ni), gold (Au), silver (Ag), copper (Cu), aluminum (Al), and/or bismuth (Bi); and/or may include a eutectic alloy including a conductive material.

At least some of the plurality of first redistribution line patterns 1131 may be integrally formed with some of the plurality of first redistribution via patterns 1133. For example, some of the plurality of first redistribution line patterns 1131 may be integrally formed with first redistribution via patterns 1133 in contact with lower surfaces of the some of the plurality of first redistribution line patterns 1131.

According to some example embodiments of the inventive concepts, each first redistribution via pattern 1133 may have a tapered shape extending with a horizontal width gradually decreasing in a direction from an upper side to a lower side thereof. For example, horizontal widths of the plurality of first redistribution via patterns 1133 may gradually decrease away from the upper surface of the first redistribution structure 110, which faces the first semiconductor chip 120.

According to some example embodiments of the inventive concepts, a thickness of the first redistribution structure 110 in the vertical direction (e.g., the Z-axis direction) may be about 30 μm to about 100 μm.

Although FIG. 1 shows that the first redistribution structure 110 is a redistribution substrate formed using a redistribution process, the present disclosure is not limited thereto. For example, a printed circuit board may be used as the first redistribution structure 110.

The first semiconductor chip 120 may be on the upper surface of the first redistribution structure 110. For example, the first semiconductor chip 120 may be mounted, in a flip chip scheme, on the first redistribution structure 110 through the chip connection bump 147 such as a microbump. Ann underfill material layer 145 encompassing the chip connection bump 147 may be between the first semiconductor chip 120 and the first redistribution structure 110. The underfill material layer 145 may include, for example, an epoxy resin formed by a capillary underfill method. However, according to some example embodiments of the inventive concept, the molding layer 141 may be directly filled in a gap between the first semiconductor chip 120 and the first redistribution structure 110 through a molded underfill process. In this case, the underfill material layer 145 may be included as part of the molding layer 141 and thereby omitted.

The first semiconductor chip 120 may include a semiconductor substrate 121, a front end of line (FEOL) structure 123, a first back end of line (BEOL) structure 125, and a second BEOL structure 130.

The semiconductor substrate 121 may include a first surface 121F and a second surface 121B that is opposite to the first surface 121F in the vertical direction (e.g., the Z-direction). The first surface 121F of the semiconductor substrate 121 may be an active surface of the semiconductor substrate 121, and the second surface 121B of the semiconductor substrate 121 may be an inactive surface of the semiconductor substrate 121. The first semiconductor chip 120 may be arranged so that the first surface 121F of the semiconductor substrate 121 faces the first redistribution structure 110. A passivation layer 129 covering the second surface 121B of the semiconductor substrate 121 may be formed on the second surface 121B of the semiconductor substrate 121.

The semiconductor substrate 121 may be, for example, a semiconductor wafer. The semiconductor substrate 121 may include a semiconductor material, for example, silicon (Si). Alternatively, the semiconductor substrate 121 may include a semiconductor element such as germanium (Ge), and/or a compound semiconductor such as silicon carbide (SiC), gallium arsenide (GaAs), indium arsenide (InAs), and/or indium phosphide (InP). The semiconductor substrate 121 may include a conductive area, for example, an impurity-doped well and/or an impurity-doped structure. In addition, the semiconductor substrate 121 may have various device isolation structures such as a shallow trench isolation (STI) structure.

The FEOL structure 123 may be on the first surface 121F of the semiconductor substrate 121. The FEOL structure 123 may include various types of a plurality of individual devices and/or interlayer insulating layers. The plurality of individual devices may include various microelectronic devices (e.g., a metal-oxide-semiconductor field effect transistor (MOSFET), a system large scale integration (LSI) chip, an image sensor such as a CMOS image sensor (CIS), a micro-electro-mechanical system (MEMS), an active device, a passive device, and/or the like). The plurality of individual devices may be electrically connected to the conductive area of the semiconductor substrate 121. In addition, the plurality of individual devices may be electrically isolated from other neighboring individual devices by the interlayer insulating layers.

The first BEOL structure 125 may be on the FEOL structure 123. The first BEOL structure 125 may be referred to as a front-side BEOL structure on a front-side of the semiconductor substrate 121. The first BEOL structure 125 may have the same footprint as a footprint of the semiconductor substrate 121.

The first BEOL structure 125 may include a first interconnect pattern 127 and a plurality of first interlayer insulating layers 126 configured to insulate the first interconnect pattern 127. The first interconnect pattern 127 may be electrically connected to an individual device such as a transistor in the FEOL structure 123. The plurality of first interlayer insulating layers 126 may be stacked on one another in the vertical direction (e.g., the Z-axis direction) on the first surface 121F of the semiconductor substrate 121.

The first interconnect pattern 127 of the first BEOL structure 125 may include a plurality of first conductive line patterns 1271 and a plurality of first conductive via patterns 1273. The plurality of first conductive line patterns 1271 may be on at least one of an upper and/or a lower surface of the plurality of first interlayer insulating layers 126. The plurality of first conductive via patterns 1273 may extend through at least one layer of the plurality of first interlayer insulating layers 126. The plurality of first conductive via patterns 1273 may electrically connect first conductive line patterns 1271 on different levels in the vertical direction (e.g., the Z-axis direction). The first interconnect pattern 127 may include a conductive material such as a metal. For example, the interconnection pattern 127 may include at least one of Cu, Al, W, Ti, Ta, In, Mo, Mn, Co, Sn, Ni, Mg, Re, Be, Ga, Ru, and/or an alloy thereof.

Some of the plurality of first conductive line patterns 1271 may be on an upper surface of the first BEOL structure 125 to form electrode pads respectively connected to lower ends of through electrodes 128. In addition, some of the plurality of first conductive line patterns 1271 may be on a lower surface of the first BEOL structure 125 to form bump pads respectively connected to the chip connection bumps 147.

According to some example embodiments of the inventive concepts, each first conductive via pattern 1273 may have a tapered shape extending with a horizontal width gradually decreasing in a direction from a lower side to an upper side thereof. For example, the horizontal width of each first conductive via pattern 1273 may be gradually narrow toward the first surface 121F of the semiconductor substrate 121.

According to some example embodiments of the inventive concepts, a thickness of the first BEOL structure 125 in the vertical direction (e.g., the Z-axis direction) may be about 2 μm to about 10 μm. For example, the thickness of the first BEOL structure 125 may be about 2 μm to about 5 μm.

The second BEOL structure 130 may be on the second surface 121B of the semiconductor substrate 121. The second BEOL structure 130 may have the same footprint as the footprint of the semiconductor substrate 121. According to some example embodiments, each of the second BEOL structure 130 and the first BEOL structure 125 may have the same footprint as the footprint of the semiconductor chip 120. The second BEOL structure 130 may be referred to as a back-side BEOL structure on a back-side of the semiconductor substrate 121.

The second BEOL structure 130 may include a second interconnect pattern 133 and a plurality of second interlayer insulating layers 131 configured to insulate the second interconnect pattern 133. The plurality of second interlayer insulating layers 131 may be stacked on one another in the vertical direction (e.g., the Z-axis direction) on the second surface 121B of the semiconductor substrate 121.

The second interconnect pattern 133 of the second BEOL structure 130 may include a plurality of second conductive line patterns 1331 and a plurality of second conductive via patterns 1333. The plurality of second conductive line patterns 1331 may be on at least one of upper and lower surfaces of the plurality of second interlayer insulating layers 131. The plurality of second conductive via patterns 1333 may extend by passing through at least one the plurality of second interlayer insulating layers 131. The plurality of second conductive via patterns 1333 may electrically connect second conductive line patterns 1331 on different levels in the vertical direction (e.g., the Z-axis direction). For example, the second interconnect pattern 133 may include a conductive material such as a metal. For example, the second interconnect pattern 133 may include at least one of Cu, Al, W, Ti, Ta, In, Mo, Mn, Co, Sn, Ni, Mg, Re, Be, Ga, Ru, and/or an alloy thereof.

Some of the plurality of second conductive line patterns 1331 may be on an upper surface of the second BEOL structure 130 to be connected to a second redistribution pattern 153 of the second redistribution structure 150. Some of the plurality of second conductive line patterns 1331 may be on a lower surface of the second BEOL structure 130 to form electrode pads respectively connected to upper ends of the through electrodes 128.

According to some example embodiments of the inventive concepts, each second conductive via pattern 1333 may have a tapered shape extending with a horizontal width gradually decreasing in a direction from an upper side to a lower side thereof. For example, the horizontal width of each second conductive via pattern 1333 may be gradually narrow toward the second surface 121B of the semiconductor substrate 121.

According to some example embodiments of the inventive concepts, a thickness of the second BEOL structure 130 in the vertical direction (e.g., the Z-axis direction) may be about 2 μm to about 10 μm. For example, the thickness of the second BEOL structure 130 may be about 2 μm to about 5 μm.

The first semiconductor chip 120 may include through electrodes 128 extending in the vertical direction (e.g., the Z-axis direction) and passing through the semiconductor substrate 121. The through electrode 128 may electrically connect the first interconnect pattern 127 of the first BEOL structure 125 to the second interconnect pattern 133 of the second BEOL structure 130. For example, the through electrode 128 may extend through the FEOL structure 123 to physically and/or electrically connect to the first interconnect pattern 127. In addition, the through electrode 128 may extend through the semiconductor substrate 121 and the passivation layer 129 covering the second surface 121B of the semiconductor substrate 121 to physically and/or electrically connect to the second interconnect pattern 133. The through electrode 128 may include, for example, a pillar-shaped core conductor and/or a cylindrical conductive barrier layer encompassing a sidewall of the core conductor. Although not particularly shown, a via insulating layer may be between the through electrode 128 and the semiconductor substrate 121 and between the through electrode 128 and the FEOL structure 123.

According to some example embodiments of the inventive concepts, the first semiconductor chip 120 may be a memory chip. For example, the first semiconductor chip 120 may include a volatile memory chip and/or a nonvolatile memory chip. The volatile memory chip may include, for example, dynamic random access memory (DRAM), high bandwidth memory (HBM) DRAM, static RAM (SRAM), thyristor RAM (TRAM), zero capacitor RAM (ZRAM), and/or twin transistor RAM (TTRAM). The nonvolatile memory chip may include, for example, flash memory, magnetic RAM (MRAM), spin-transfer torque MRAM (STT-MRAM), ferroelectric RAM (FRAM), phase change RAM (PRAM), resistive RAM (RRAM), nanotube RRAM, polymer RAM, and/or insulator resistance change memory.

According to some example embodiments of the inventive concepts, the first semiconductor chip 120 may be a logic chip. For example, the first semiconductor chip 120 may be a central processing unit (CPU), a graphics-processing unit (GPU), and/or an application processor (AP).

According to some example embodiments, the first semiconductor chip 120 may include, as a communication chip, a signal processing circuit configured to process a radio signal and the like. For example, the first semiconductor chip 120 may include a radio-frequency integrated circuit (RFIC).

Although FIG. 1 shows that the semiconductor package 1000 includes one semiconductor chip, the semiconductor package 1000 is not limited thereto. For example, two or more semiconductor chips separated in a horizontal direction (e.g., an X-axis direction and/or a Y-axis direction) may be on the first redistribution structure 110. The two or more semiconductor chips may be homogeneous and/or heterogeneous chips.

The molding layer 141 may be on the first redistribution structure 110 and cover at least a portion of the first semiconductor chip 120. For example, the molding layer 141 may extend along a sidewall of the first semiconductor chip 120. For example, the molding layer 141 may extend along a sidewall of the first BEOL structure 125, a sidewall of the FEOL structure 123, a sidewall of the semiconductor substrate 121, and/or a sidewall of the second BEOL structure 130. According to some example embodiments of the inventive concepts, the molding layer 141 may include an insulating polymer and/or an epoxy resin. For example, the molding layer 141 may include an epoxy mold compound (EMC). According to some example embodiments of the inventive concepts, an upper surface of the molding layer 141 may be on generally the same level as an upper surface of the first semiconductor chip 120.

The conductive post 143 may be apart in the horizontal direction (e.g., an X-axis direction and/or a Y-axis direction) from the sidewall of the first semiconductor chip 120. The conductive post 143 may include a through mold via extending in the vertical direction (e.g., the Z-axis direction) and passing through the molding layer 141. The conductive post 143 may include a conductive material, for example, Cu.

The conductive post 143 may include a vertical connection conductor electrically connecting the first interconnect pattern 127 of the first redistribution structure 110 to the second redistribution pattern 153 of the second redistribution structure 150. A lower end of the conductive post 143 may be connected to a portion of the first interconnect pattern 127 on the upper surface of the first redistribution structure 110, and an upper end of the conductive post 143 may be connected to a portion of the second redistribution pattern 153 on a lower surface of the second redistribution structure 150. A level of the upper end of the conductive post 143 in the vertical direction (e.g., the Z-axis direction) may be higher than or equal to the upper surface of the second BEOL structure 130 of the first semiconductor chip 120.

The second redistribution structure 150 may include the second redistribution pattern 153 and a plurality of second redistribution insulating layers 151 covering the second redistribution pattern 153.

The second redistribution structure 150 may cover the upper surface of the first semiconductor chip 120 and/or the upper surface of the molding layer 141. A horizontal width and/or a horizontal area of the second redistribution structure 150 may be greater than a horizontal width and/or a horizontal area of the first semiconductor chip 120, respectively. According to some example embodiments of the inventive concepts, a footprint of the second redistribution structure 150 may be the same as the footprint of the first redistribution structure 110. The footprint of the second redistribution structure 150 and the footprint of the first redistribution structure 110 may be the same as a footprint of the semiconductor package 1000.

The second redistribution structure 150 may be on the second BEOL structure 130 of the first semiconductor chip 120 and have a footprint that is greater than the footprint of the second BEOL structure 130. For example, with respect to a first direction (e.g., the X-axis direction or the Y-axis direction) that is parallel to the second surface 121B of the semiconductor substrate 121, a width of the footprint occupied by the second redistribution structure 150 in the first direction may be greater than a width of the footprint occupied by the second BEOL structure 130 in the first direction.

The plurality of second redistribution insulating layers 151 may be stacked on one another in the vertical direction (e.g., the Z-axis direction). The plurality of second redistribution insulating layers 151 may include a material layer including an organic compound. For example, each of the plurality of second redistribution insulating layers 151 may include at least one of a photo imageable dielectric (PID), a thermoset molding film such as an Ajinomoto build-up film (ABF), and/or a photosensitive polyimide (PSPI).

The second redistribution pattern 153 may include a plurality of second redistribution line patterns 1531 on at least one of the upper and/or lower surfaces of the plurality of second redistribution insulating layers 151, and a plurality of second redistribution via patterns 1533 extending through at least one of the plurality of second redistribution insulating layers 151. The plurality of second redistribution via patterns 1533 may electrically connect second redistribution line patterns 1531 on different levels in the vertical direction (e.g., the Z-axis direction). The second redistribution pattern 153 may include a conductive material such as a metal. For example, the second redistribution pattern 153 may include at least one of Cu, Al, W, Ti, Ta, In, Mo, Mn, Co, Sn, Ni, Mg, Re, Be, Ga, Ru, and/or an alloy thereof.

Some of the plurality of second redistribution line patterns 1531 may be on the lower surface of the second redistribution structure 150 to form connection pads respectively connected to upper ends of conductive posts 143.

At least some of the plurality of second redistribution line patterns 1531 may be integrally formed with some of the plurality of second redistribution via patterns 1533. For example, some of the plurality of second redistribution line patterns 1531 may integrally formed with second redistribution via patterns 1533 in contact with lower surfaces of the some of the plurality of second redistribution line patterns 1531.

According to some example embodiments of the inventive concepts, each second redistribution via pattern 1533 may have a tapered shape extending with a horizontal width gradually decreasing in a direction from an upper side to a lower side thereof. For example, horizontal widths of the plurality of second redistribution via patterns 1533 may gradually decrease toward the lower surface of the second redistribution structure 150, which faces the upper surface of the first semiconductor chip 120.

A gradient of a sidewall of the second redistribution via pattern 1533 may be greater than a gradient of a sidewall of the second conductive via pattern 1333 of the second BEOL structure 130. According to some example embodiments of the inventive concepts, a first contained angle between the sidewall of the second redistribution via pattern 1533 and a vertical direction (e.g., the Z-axis direction) that is perpendicular to the second surface 121B of the semiconductor substrate 121 may be greater than a second contained angle between the sidewall of the second conductive via pattern 1333 and the vertical direction (e.g., the Z-axis direction). For example, the first contained angle may be between about 25° to about 30°, and the second contained angle may be between about 0.1° to about 10°.

According to example embodiments of the inventive concepts, a thickness of the second redistribution structure 150 in the vertical direction (e.g., the Z-axis direction) may be about 10 µm to about 100 µm.

A signal between an external device (e.g., a device outside the semiconductor package 1000) and the first semiconductor chip 120 may be transmitted through an electrical path over the external connection terminal 160, the first redistribution pattern 113 of the first redistribution structure 110, the conductive post 143, and the second redistribution pattern 153 of the second redistribution structure 150). Alternatively, the signal between the external device and the first semiconductor chip 120 may be transmitted through an electrical path over the external connection terminal 160, the first redistribution pattern 113 of the first redistribution structure 110, and the chip connection bump 147.

For example, a power/ground signal and/or an input/output data signal may be transmitted between the external device and an individual device in the first semiconductor chip 120 through an electrical path over the external connection terminal 160, the first redistribution pattern 113 of the first redistribution structure 110, the chip connection bump 147, and the first interconnect pattern 127 of the first BEOL structure 125. Alternatively, the power/ground signal and/or the input/output data signal may be transmitted between the external device and an individual device in the first semiconductor chip 120 through an electrical path over the external connection terminal 160, the first redistribution pattern 113 of the first redistribution structure 110, the conductive post 143, the second redistribution pattern 153 of the second redistribution structure 150, the second interconnect pattern 133 of the second BEOL structure 130, the through electrode 128, and the first interconnect pattern 127 of the first BEOL structure 125. In some example embodiments, the power/ground signal may be transmitted through one of the electrical paths, and the input/output data signal may be transmitted through another electrical path.

For example, when the first semiconductor chip 120 is a communication chip configured to transmit a radio signal, an antenna pattern for transmission and reception of the radio signal may be in the second BEOL structure 130. In this case, the signal may be transmitted through an electrical path over the first interconnect pattern 127 of the first BEOL structure 125, the chip connection bump 147, the first redistribution pattern 113 of the first redistribution structure 110, the conductive post 143, the second redistribution pattern 153 of the second redistribution structure 150, and the antenna pattern in the second BEOL structure 130. Alternatively, the signal may be transmitted through an electrical path over the first interconnect pattern 127 of the first BEOL structure 125, the through electrode 128, and the antenna pattern in the second BEOL structure 130.

Although FIG. 1 shows that the through electrode 128 of the first semiconductor chip 120 has a via-middle structure in which the through electrode 128 passes through the semiconductor substrate 121 and the FEOL structure 123, the through electrode 128 of the first semiconductor chip 120 may have a via-first structure and/or a via-last structure. For example, the through electrode 128 of the first semiconductor chip 120 may pass through the semiconductor substrate 121, the interlayer insulating layers of the FEOL structure 123, and/or the plurality of first interlayer insulating layers 126 of the first BEOL structure 125. For example, in some example embodiments, the through electrode 128 of the first semiconductor chip 120 may pass through only the semiconductor substrate 121 and be electrically connected to the first interconnect pattern 127 of the first BEOL structure 125 through a conductive connection wiring in the FEOL structure 123.

Figure 2:
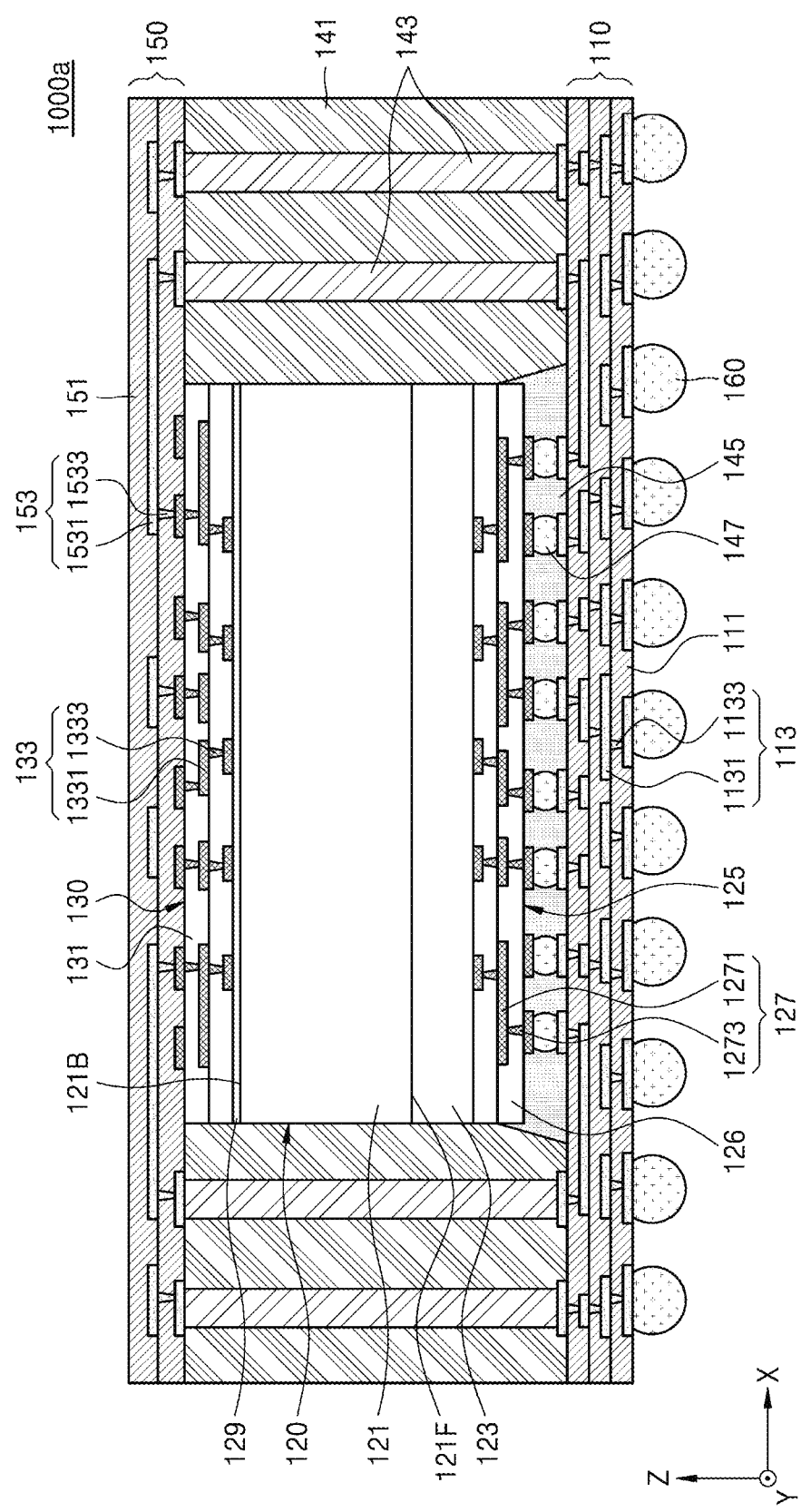
FIG. 2 is a cross-sectional view of a semiconductor package according to some example embodiments of the inventive concepts.

FIG. 2 is a cross-sectional view of a semiconductor package 1000a according to some example embodiments of the inventive concepts.

The semiconductor package 1000a shown in FIG. 2 may be generally the same as or similar to the semiconductor package 1000 shown in FIG. 1 except that the first semiconductor chip 120 does not include through electrodes (128 of FIG. 1).

For example, when the first semiconductor chip 120 is a communication chip configured to transmit a radio signal, the signal may be transmitted through an electrical path over the first interconnect pattern 127 of the first BEOL structure 125, the chip connection bump 147, the first redistribution pattern 113 of the first redistribution structure 110, the conductive post 143, the second redistribution pattern 153 of the second redistribution structure 150, and the antenna pattern in the second BEOL structure 130.

For example, a test signal output from the first semiconductor chip 120 may be output to an external device through an electrical path sequentially over the first interconnect pattern 127 of the first BEOL structure 125, the chip connection bump 147, a portion of the first redistribution pattern 113 of the first redistribution structure 110, any one of the conductive posts 143, a portion of the second redistribution pattern 153 of the second redistribution structure 150, the second interconnect pattern 133 of the second BEOL structure 130, another portion of the second redistribution pattern 153 of the second redistribution structure 150, another one of the conductive posts 143, another portion of the first redistribution pattern 113 of the first redistribution structure 110, and the external connection terminal 160. By using the second BEOL structure 130 as a signal routing path, the complexity of an interconnect design of the first redistribution structure 110 may be lowered.

Figure 3:
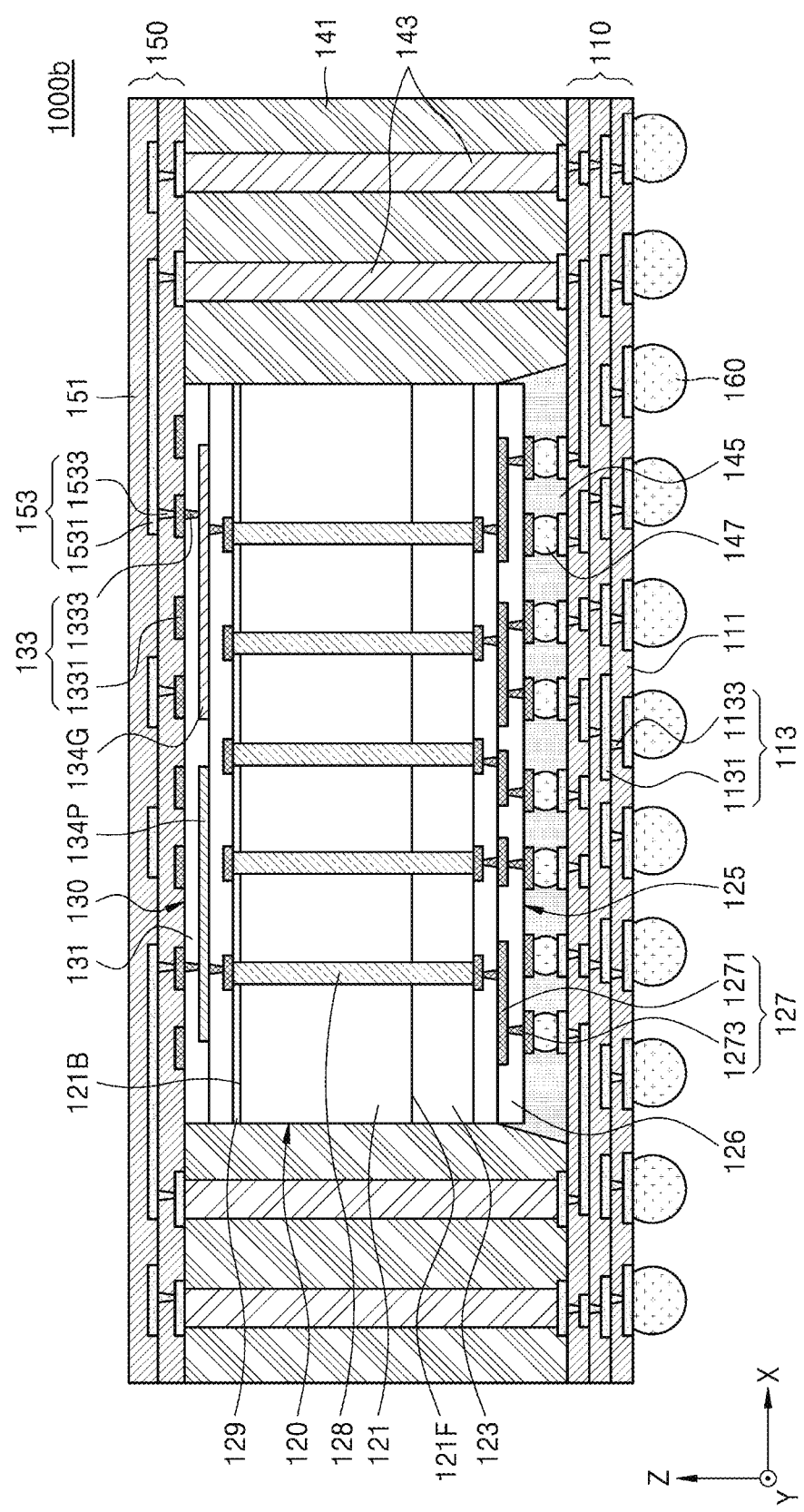
FIG. 3 is a cross-sectional view of a semiconductor package according to some example embodiments of the inventive concepts.

FIG. 3 is a cross-sectional view of a semiconductor package 1000b according to some example embodiments of the inventive concepts. Hereinafter, differences from the semiconductor package 1000 described with reference to FIG. 1 will be mainly described.

Referring to FIG. 3, the second BEOL structure 130 of the first semiconductor chip 120 may form a power distribution network.

According to some example embodiments of the inventive concepts, the second BEOL structure 130 may include a power plane 134P to which a driving voltage is applied, and a ground plane 134G to which a ground voltage is applied. Both the power plane 134P and the ground plane 134G may be formed in an interconnect process for forming the second interconnect pattern 133. The power plane 134P and the ground plane 134G may be formed, for example, of the same material as that of the second interconnect pattern 133.

The power plane 134P may receive a driving voltage provided from an external device, through a first electrical path over, for example, the external connection terminal 160 to which the driving voltage is input, the first redistribution pattern 113 of the first redistribution structure 110, the conductive post 143, the second redistribution pattern 153 of the second redistribution structure 150, the second conductive line pattern 1331, and the second conductive via pattern 1333. In addition, power distributed from the power plane 134P may be transmitted to a device and/or devices (e.g., individual devices formed in the FEOL structure 123) in the first semiconductor chip 120 through an electrical path over, for example, the through electrode 128 and the first interconnect pattern 127 of the first BEOL structure 125.

Although FIG. 3 shows that the power plane 134P has a single-layer structure, the second BEOL structure 130 may include power planes 134P located on different levels in the vertical direction (e.g., the Z-axis direction) to form a multi-layer structure.

The ground plane 134G may receive a ground voltage provided from an external device, through a second electrical path over, for example, an external connection terminal 160 to which the ground voltage is input, the first redistribution pattern 113 of the first redistribution structure 110, the conductive post 143, the second redistribution pattern 153 of the second redistribution structure 150, the second conductive line pattern 1331, and the second conductive via pattern 1333. In addition, power distributed from the ground plane 134G may be transmitted to a device and/or devices in the first semiconductor chip 120 through an electrical path over, for example, the through electrode 128 and the first interconnect pattern 127 of the first BEOL structure 125.

Although FIG. 3 shows that the ground plane 134G has a single-layer structure, the second BEOL structure 130 may include ground planes 134G located on different levels in the vertical direction (e.g., the Z-axis direction) to form a multi-layer structure.

According to some example embodiments of the inventive concepts, by forming the power distribution network including the power plane 134P and the ground plane 134G in the second BEOL structure 130 at a back side of the first semiconductor chip 120 the complexity of an interconnect design of the first redistribution structure 110 may be lowered.

Figure 4A:
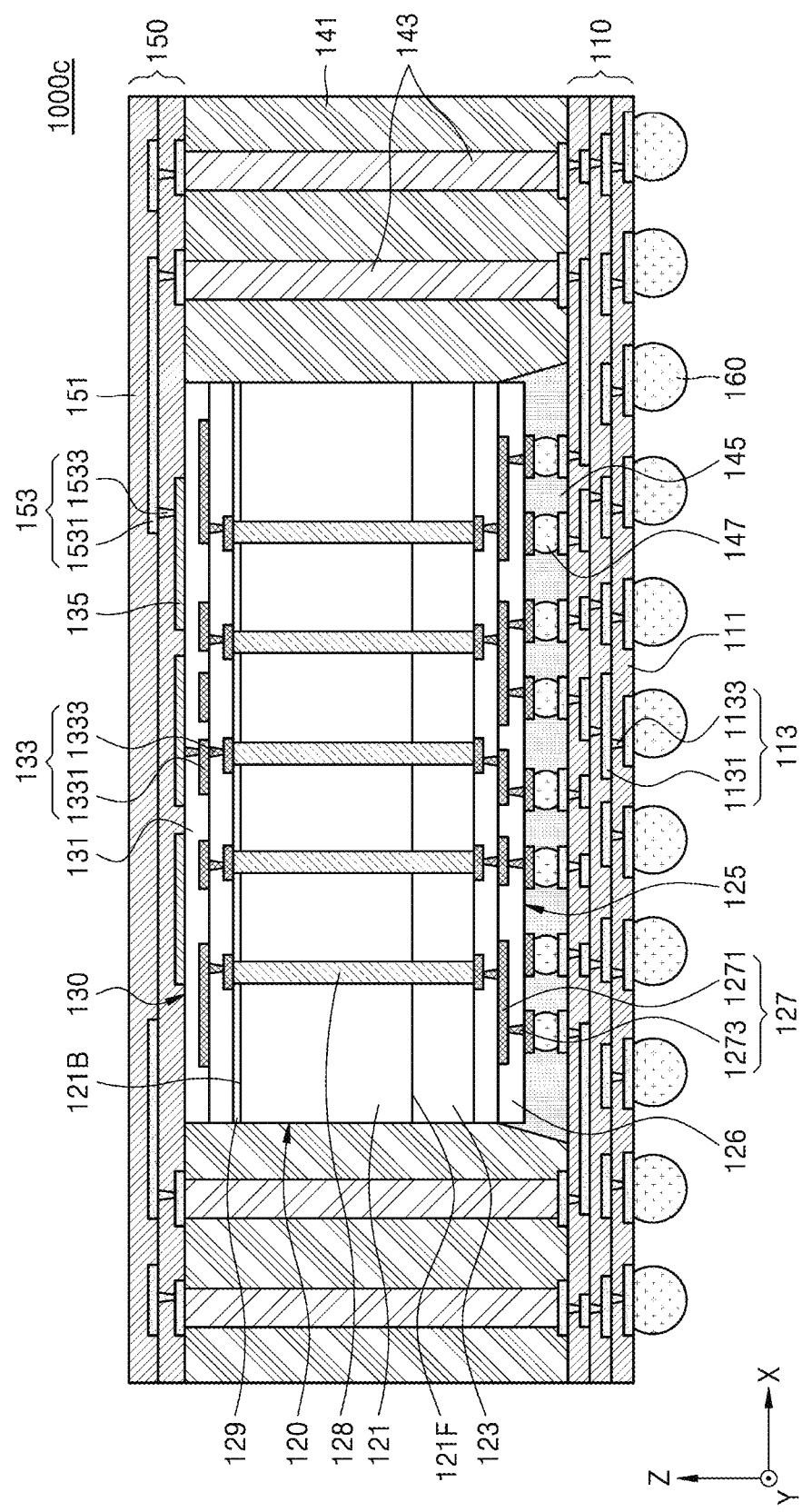
FIG. 4A is a cross-sectional view of a semiconductor package according to some example embodiments of the inventive concepts.
Figure 4B:
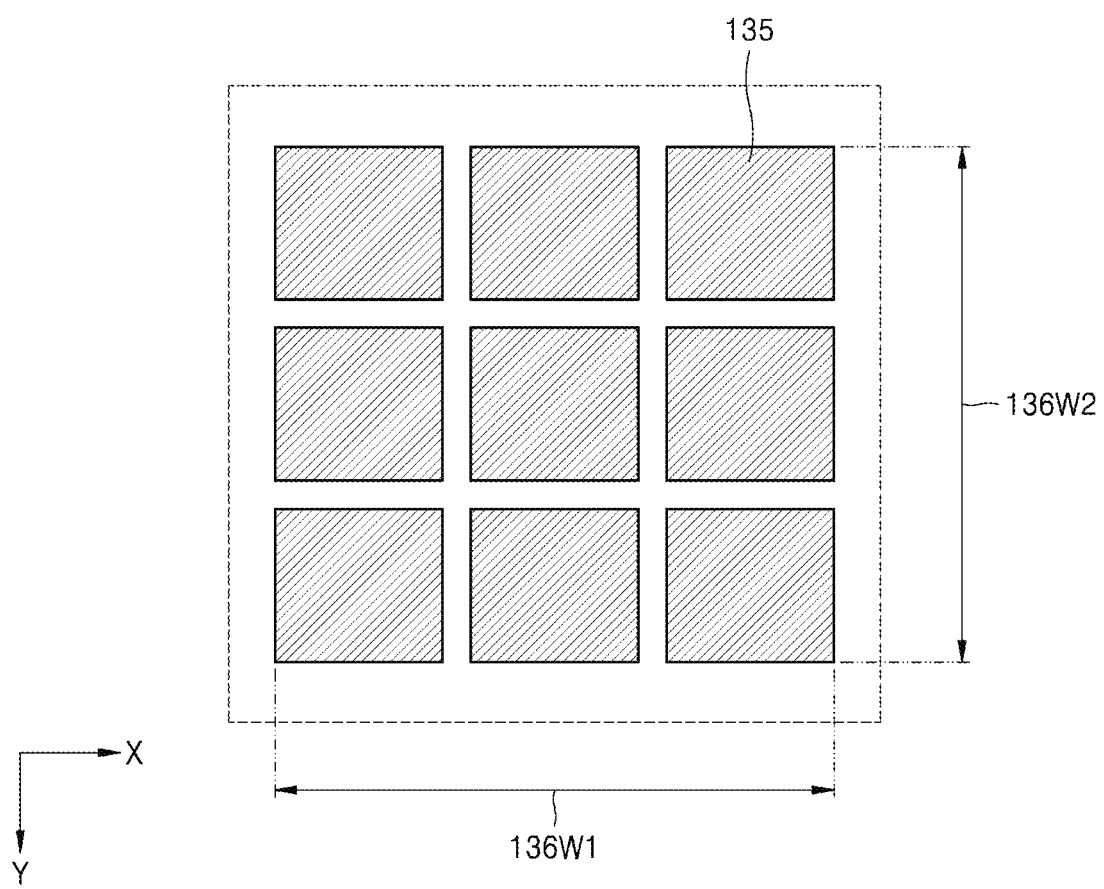
FIG. 4B is a top view of a first antenna pattern of FIG. 4A.

FIG. 4A is a cross-sectional view of a semiconductor package 1000c according to example embodiments of the inventive concept. FIG. 4B is a top view of a first antenna pattern 135 of FIG. 4A. Hereinafter, differences from the semiconductor package 1000 described with reference to FIG. 1 will be mainly described.

Referring to FIGS. 4A and 4B, the first semiconductor chip 120 may be a communication chip such as an RFIC chip, and the second BEOL structure 130 of the first semiconductor chip 120 may include the first antenna pattern 135 configured to transmit and/or receive a radio signal. The first antenna pattern 135 may be formed together in an interconnect process for forming the second interconnect pattern 133. The first antenna pattern 135 may be formed, for example, of the same material as that of the second interconnect pattern 133.

As shown in FIG. 4A, the first antenna pattern 135 may be on the top second interlayer insulating layer 131 among the plurality of second interlayer insulating layers 131.

Alternatively, unlike shown in FIG. 4A, the first antenna pattern 135 may have a structure buried between layers of the plurality of second interlayer insulating layers 131.

In addition, although FIG. 4A shows that the first antenna pattern 135 is a single-layer pattern, the first antenna pattern 135 may include a plurality of patterns on different levels in the vertical direction (e.g., the Z-axis direction). In addition, although not particularly shown in FIG. 4A, the second BEOL structure 130 may include an electrical ground structure for antenna signal transmission and/or a feeding structure suitably configured according to a feeding scheme.

The first antenna pattern 135 may be electrically connected to a device and/or devices (e.g., individual devices formed in the FEOL structure 123) in the first semiconductor chip 120 through a third electrical path over the second redistribution pattern 153 of the second redistribution structure 150, the conductive post 143, the first redistribution pattern 113 of the first redistribution structure 110, the chip connection bump 147, and the first interconnect pattern 127 of the first BEOL structure 125. Alternatively, the first antenna pattern 135 may be electrically connected to the devices in the first semiconductor chip 120 through a fourth electrical path over the second interconnect pattern 133 of the second BEOL structure 130, the through electrode 128, and the first interconnect pattern 127 of the first BEOL structure 125.

The first antenna pattern 135 may include a patch antenna. For example, the first antenna pattern 135 may include unit patterns in a single-array or multi-array form, and each unit pattern of the first antenna pattern 135 may be a patch antenna. The patch antenna may have a polygonal shape, such as a quadrangle, and/or a circular shape. For example, as shown in FIG. 4B, the first antenna pattern 135 may include nine patch antennas arranged in three rows and three columns. However, the shape and/or arrangement of the first antenna pattern 135 are not limited thereto, and the first antenna pattern 135 may have various shapes and/or arrangements suitable to perform communication of a desired frequency band. For example, the first antenna pattern 135 may have a dipole antenna structure, a meander structure, and/or the like.

The second BEOL structure 130 of the first semiconductor chip 120 may have an antenna arrangement region in which the first antenna pattern 135 is arranged. Herein, the antenna arrangement region may indicate a region having a minimum area included in a quadrangular region capable of accommodating the first antenna pattern 135 therein and/or a boundary region around the first antenna pattern 135. For example, as shown in FIG. 4B, when the first antenna pattern 135 includes nine patch antennas arranged in three rows and three columns, a first horizontal width 136W1 of the antenna arrangement region in a first horizontal direction (e.g., the X-axis direction) that is parallel to the second surface 121B of the semiconductor substrate 121 may be the same as a sum of three times a width of each patch antenna in the first horizontal direction and two times a gap between neighboring patch antennas in the first horizontal direction. In addition, a second horizontal width 136W2 of the antenna arrangement region in a second horizontal direction (e.g., the Y-axis direction) that is perpendicular to the first horizontal direction may be the same as a sum of three times a width of each patch antenna in the second horizontal direction and two times a gap between neighboring patch antennas in the second horizontal direction. The antenna arrangement region may further include a boundary value for each of the first and second horizontal widths 136W1 and/or 136W2. For example, the antenna arrangement region may indicate a region defined by the first horizontal width 136W1 (and a first boundary value) and the second horizontal width 136W2 (and a second boundary value).

According to example embodiments of the inventive concepts, the first antenna pattern 135 may be arranged in a region in which each of the first horizontal width 136W1 in the first horizontal direction (e.g., the X-axis direction) and the second horizontal width 136W2 in the second horizontal direction (e.g., the Y-axis direction) is 5 mm or less. For example, the first horizontal width 136W1 of the antenna arrangement region in the first horizontal direction (e.g., the X-axis direction) may be about 1 mm to about 5 mm (including the first boundary value), and the second horizontal width 136W2 of the antenna arrangement region in the second horizontal direction (e.g., the Y-axis direction) may be about 1 mm to about 5 mm (including the second boundary value).

Because the first antenna pattern 135 is in the second BEOL structure 130, a footprint occupied by the antenna arrangement region may be within the footprint occupied by the first semiconductor chip 120 and/or the footprint occupied by the semiconductor substrate 121. For example, the first antenna pattern 135 may be in a region occupying a smaller area than an area of the second surface 121B of the semiconductor substrate 121. For instance, in 5G communication technology or post 5G communication technologies (e.g., 6G communication technology, 7G communication technology, and/or the like), radio signals of a millimeter wavelength band and/or of a high frequency are transmitted, and thus, an antenna structure implemented with a smaller size than a size of the first semiconductor chip 120 may be in the second BEOL structure 130.

Figure 5:
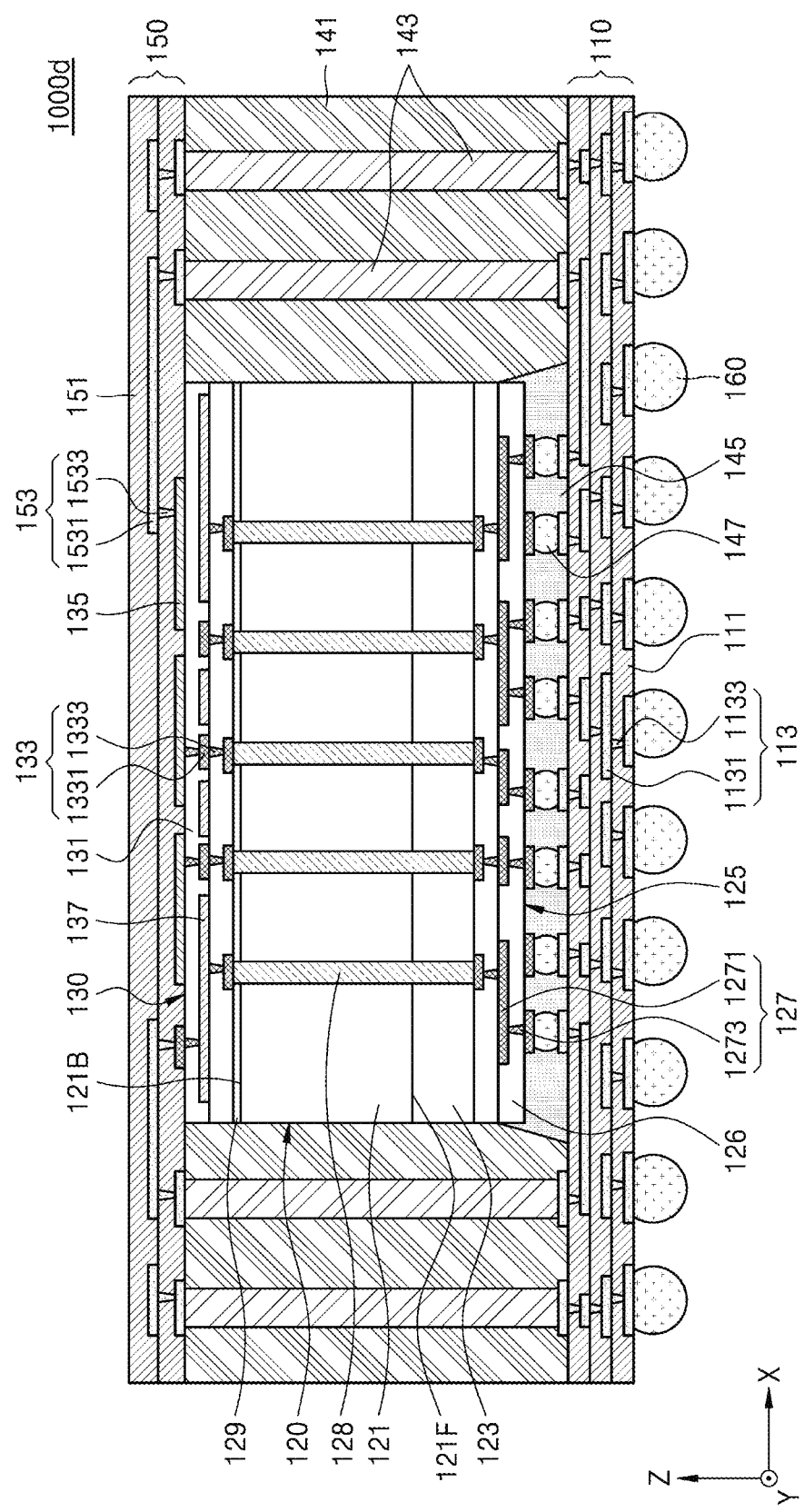
FIG. 5 is a cross-sectional view of a semiconductor package according to some example embodiments of the inventive concepts.

FIG. 5 is a cross-sectional view of a semiconductor package 1000d according to some example embodiments of the inventive concepts. Hereinafter, differences from the semiconductor package 1000c described with reference to FIGS. 4A and 4B will be mainly described.

Referring to FIG. 5, the second BEOL structure 130 of the first semiconductor chip 120 may include a reflective pattern 137. The reflective pattern 137 may be formed together in an interconnect process for forming the second interconnect pattern 133. The reflective pattern 137 may be formed, for example, of the same material as that of the second interconnect pattern 133.

The reflective pattern 137 may be configured to be electrically grounded by applying ground power thereto. For example, the reflective pattern 137 may receive a ground voltage through an electrical path over the external connection terminal 160, the first redistribution pattern 113 of the first redistribution structure 110, the conductive post 143, and the second redistribution pattern 153 of the second redistribution structure 150. Alternatively, the reflective pattern 137 may receive the ground voltage through an electrical path over the external connection terminal 160, the first redistribution pattern 113 of the first redistribution structure 110, the chip connection bump 147, the first interconnect pattern 127 of the first BEOL structure 125, and the through electrode 128.

The reflective pattern 137 and the first antenna pattern 135 may be on different levels in the vertical direction (e.g., Z-axis direction). For example, the reflective pattern 137 may be between the first antenna pattern 135 and the second surface 121B of the semiconductor substrate 121 in the vertical direction (e.g., the Z-axis direction). The reflective pattern 137 may have a planar shape. For example, the reflective pattern 137 may have a planar shape that is parallel to the second surface 121B of the semiconductor substrate 121. The reflective pattern 137 may be formed in a plane area to at least partially overlap with the first antenna pattern 135 when viewed in a plan view. The reflective pattern 137 may reflect a radio signal transmitted and/or received through the first antenna pattern 135, thereby improving an antenna gain. In addition, the reflective pattern 137 may function as an electro-magnetic interference (EMI) shielding layer for a component such as the first semiconductor chip 120 using a high frequency.

Figure 6:
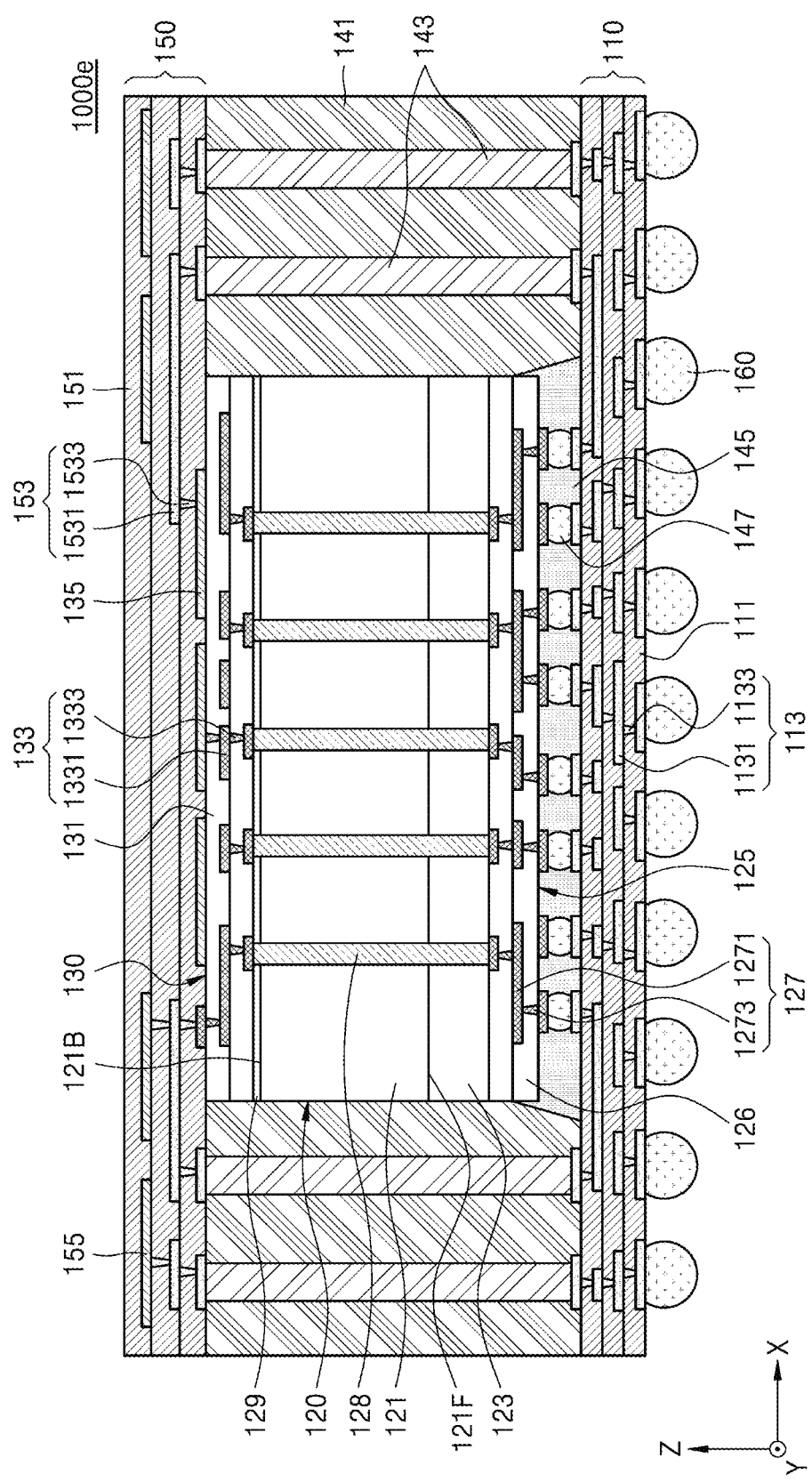
FIG. 6 is a cross-sectional view of a semiconductor package according to some example embodiments of the inventive concepts.

FIG. 6 is a cross-sectional view of a semiconductor package 1000e according to some example embodiments of the inventive concepts. Hereinafter, differences from the semiconductor package 1000c described with reference to FIGS. 4A and 4B will be mainly described.

Referring to FIG. 6, the second redistribution structure 150 may include a second antenna pattern 155. The second antenna pattern 155 may be formed together in an interconnect process for forming the second redistribution pattern 153. The second antenna pattern 155 may be, for example, formed of the same material as that of the second redistribution pattern 153.

The second antenna pattern 155 may include a patch antenna. For example, the second antenna pattern 155 may include unit patterns arranged in a single-array or multi-array form. The unit pattern of the second antenna pattern 155 may have a polygonal shape, e.g., a quadrangular shape and/or a circular shape. The unit pattern of the second antenna pattern 155 may have the same or different shape and dimension as those of the unit pattern of the first antenna pattern 135. However, a shape and/or arrangement of the second antenna pattern 155 are not limited thereto, and the second antenna pattern 155 may have various shapes and/or arrangements suitable to perform communication of a desired frequency band. For example, the second antenna pattern 155 may have a dipole antenna structure, a meander structure, and/or the like.

The second antenna pattern 155 may transmit a radio signal together with the first antenna pattern 135 on the first semiconductor chip 120. Transmission of a radio signal through the second antenna pattern 155 may be achieved through an electrical path over the first interconnect pattern 127 of the first BEOL structure 125, the chip connection bump 147, the first redistribution pattern 113 of the first redistribution structure 110, the conductive post 143, and the second redistribution pattern 153 of the second redistribution structure 150. Alternatively, transmission of a radio signal through the second antenna pattern 155 may be achieved through an electrical path over the first interconnect pattern 127 of the first BEOL structure 125, the through electrode 128, the second interconnect pattern 133 of the second BEOL structure 130, and the second redistribution pattern 153 of the second redistribution structure 150.

The second BEOL structure 130 of the first semiconductor chip 120 may have an antenna arrangement region in which the first antenna pattern 135 is arranged. Herein, the antenna arrangement region may indicate a region having a minimum area among a quadrangular region capable of accommodating the first antenna pattern 135 therein, as described above. A footprint occupied by the antenna arrangement region may be within the footprint occupied by the first semiconductor chip 120. The second antenna pattern 155 may be arranged outside the antenna arrangement region in a plan view.

Figure 7:
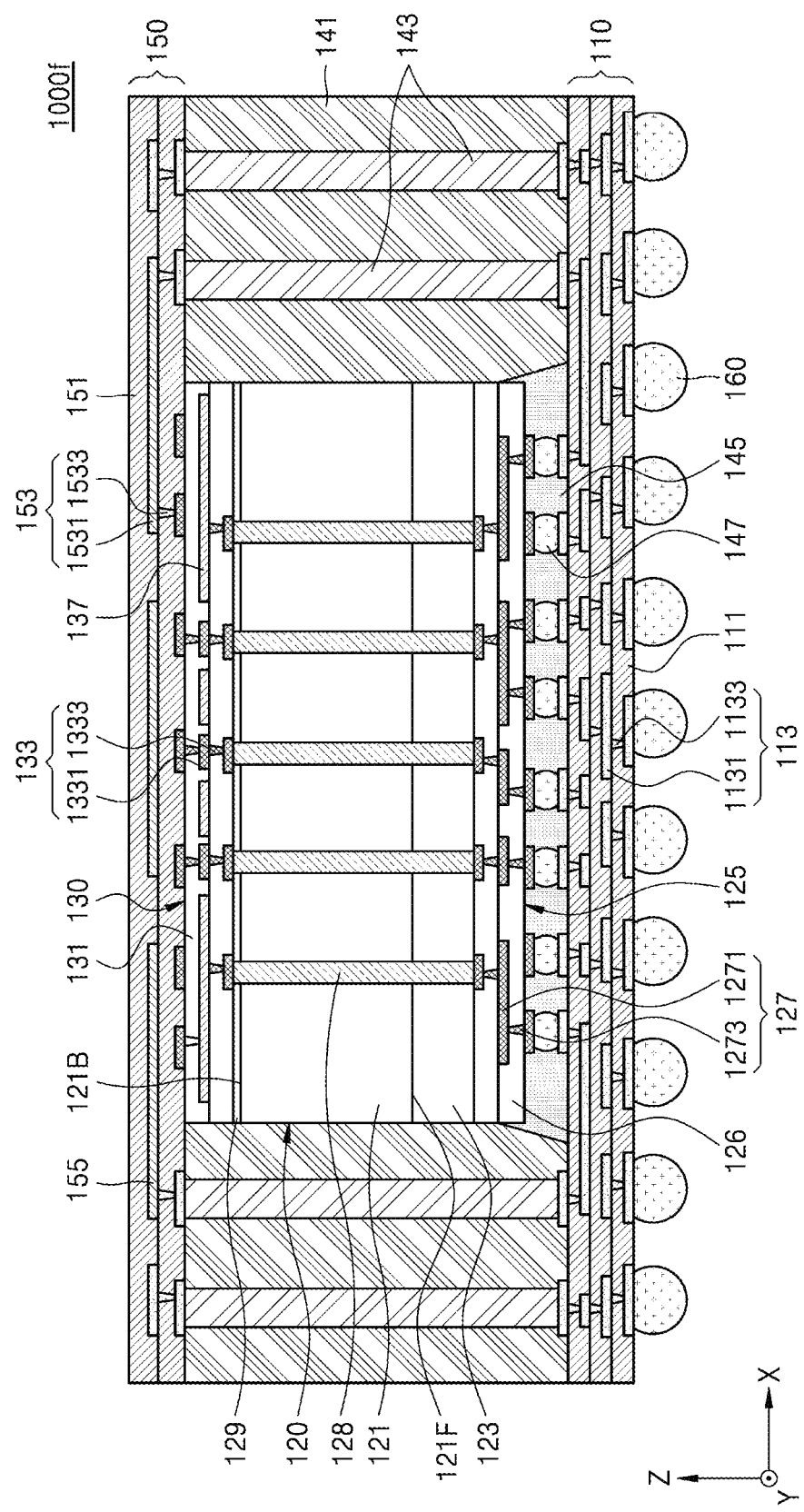
FIG. 7 is a cross-sectional view of a semiconductor package according to some example embodiments of the inventive concepts.

FIG. 7 is a cross-sectional view of a semiconductor package 1000f according to some example embodiments of the inventive concepts. Hereinafter, differences from the semiconductor package 1000d described with reference to FIG. 5 will be mainly described.

Referring to FIG. 7, the second redistribution structure 150 may include the second antenna pattern 155, and the second BEOL structure 130 of the first semiconductor chip 120 may include the reflective pattern 137. Because the second redistribution structure 150 is formed in the second redistribution structure 150 having the footprint that is greater than the footprint occupied by the first semiconductor chip 120, the second antenna pattern 155 may be formed to occupy a footprint that is greater than the footprint of the first semiconductor chip 120.

Figure 8:
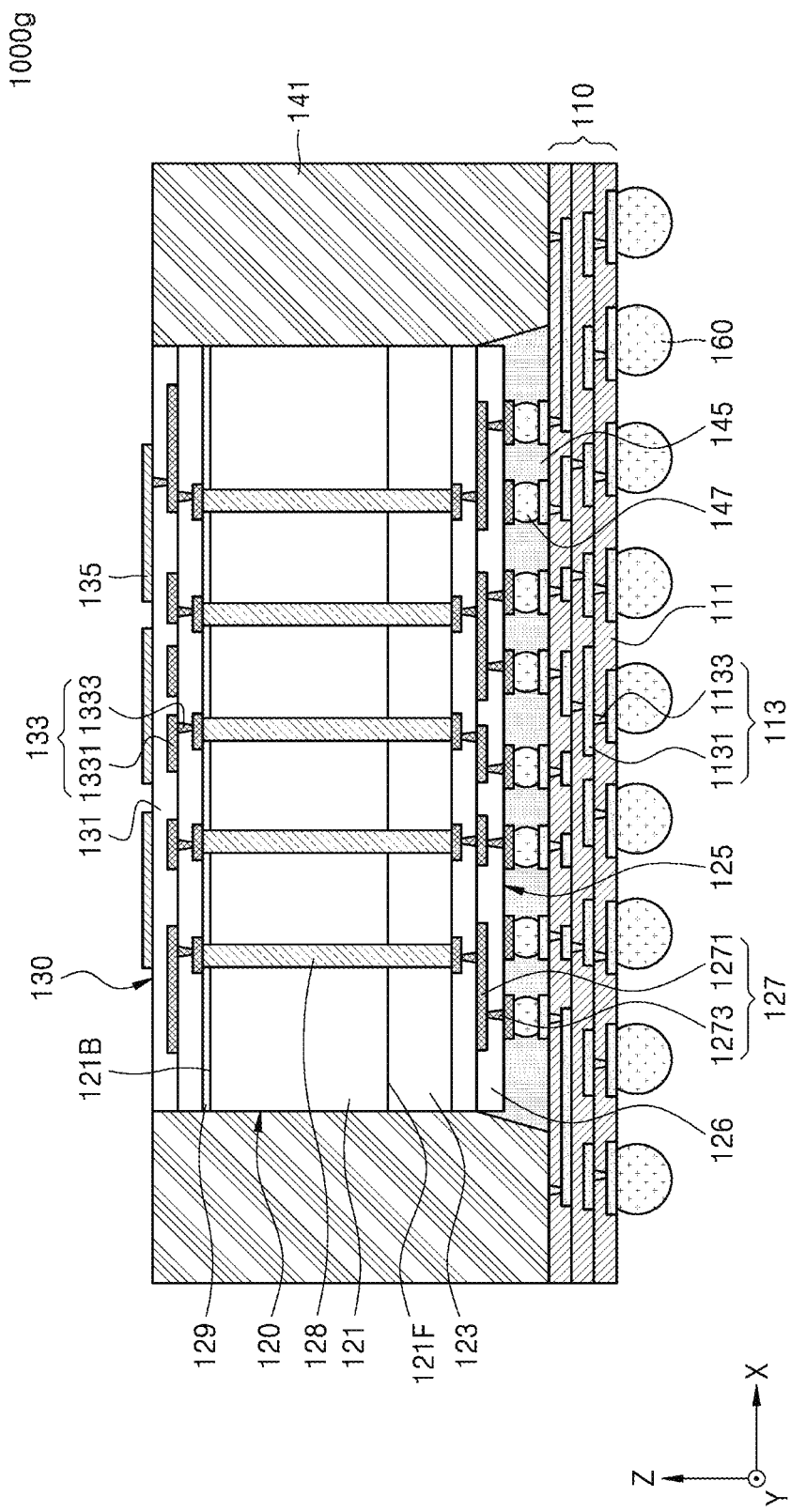
FIG. 8 is a cross-sectional view of a semiconductor package according to some example embodiments of the inventive concepts.

FIG. 8 is a cross-sectional view of a semiconductor package 1000g according to some example embodiments of the inventive concepts. Hereinafter, differences from the semiconductor package 1000c described with reference to FIGS. 4A and 4B will be mainly described.

Referring to FIG. 8, the semiconductor package 1000g may be generally the same as or similar to the semiconductor package 1000c shown in FIGS. 4A and 4B except that the conductive post 143 and the second redistribution structure 150 are omitted. Because there is no electrical path through the conductive post 143 and the second redistribution structure 150, a radio signal may be transmitted through an electrical path over the first interconnect pattern 127 of the first BEOL structure 125, the through electrode 128, the second interconnect pattern 133 of the second BEOL structure 130, and the first antenna pattern 135.

Figure 9:
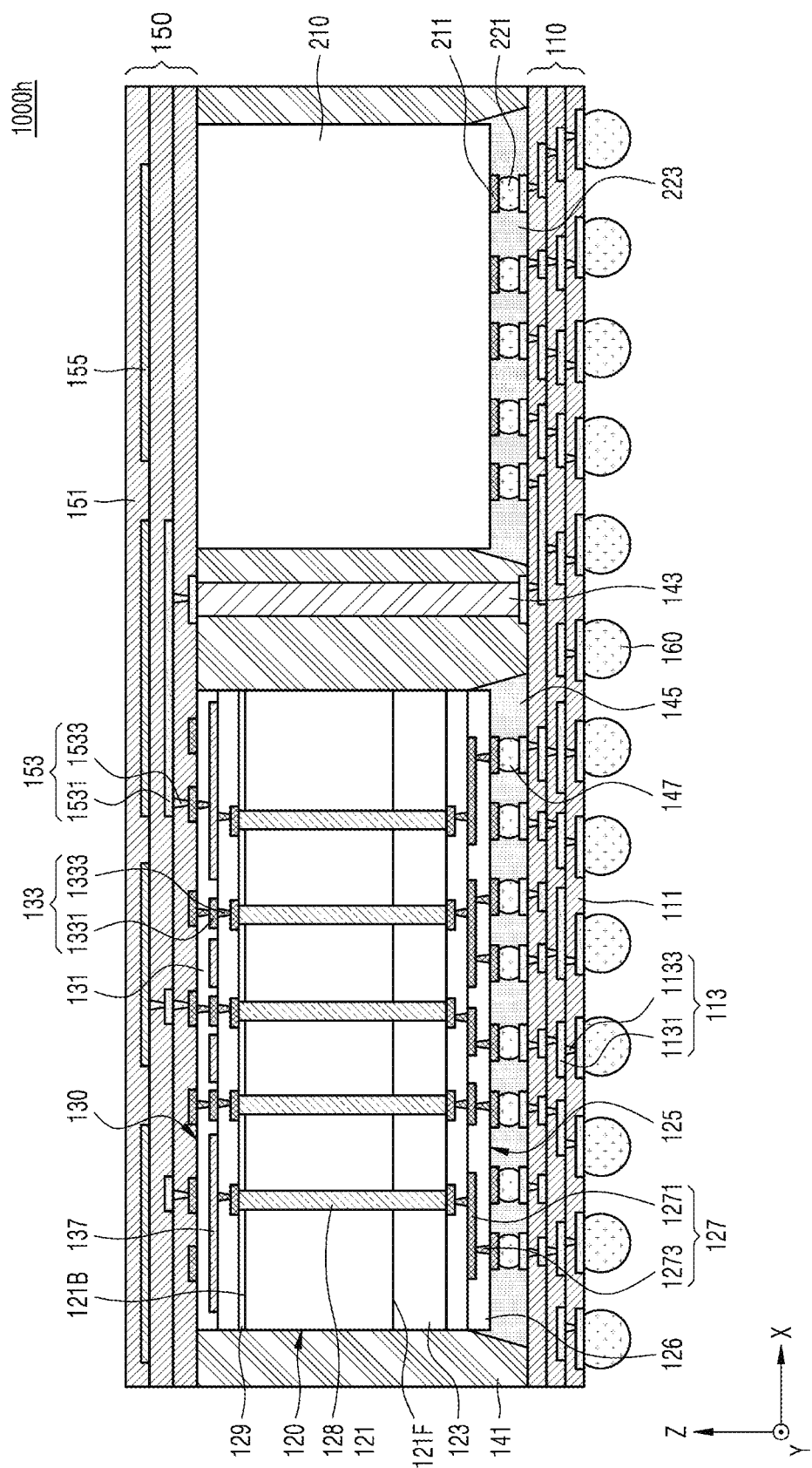
FIG. 9 is a cross-sectional view of a semiconductor package according to some example embodiments of the inventive concepts.

FIG. 9 is a cross-sectional view of a semiconductor package 1000h according to some example embodiments of the inventive concepts. Hereinafter, the description made above will be omitted or simply repeated.

Referring to FIG. 9, the semiconductor package 1000h may include the first redistribution structure 110, the first semiconductor chip 120, a second semiconductor chip 210, the molding layer 141, the conductive post 143, and the second redistribution structure 150.

According to some example embodiments of the inventive concepts, the first semiconductor chip 120 may include communication semiconductor chip such as an RFIC chip, and the second semiconductor chip 210 may include a power management integrated circuit (PMIC). The semiconductor package 1000h may further include passive components (not illustrated) such as a capacitor, a transistor, and/or an inductor.

The first semiconductor chip 120 and the second semiconductor chip 210 may be separated on the first redistribution structure 110 in the horizontal direction (e.g., the X-axis direction). The first semiconductor chip 120 and the second semiconductor chip 210 may be molded (e.g., at least partially covered) by the molding layer 141. A chip pad 211 of the second semiconductor chip 210 may be electrically connected to the first redistribution pattern 113 through a chip connection bump 221 such as a microbump. An underfill material layer 223 encompassing the chip connection bump 221 may be between the second semiconductor chip 210 and the first redistribution structure 110.

The first semiconductor chip 120 and the second semiconductor chip 210 may be electrically connected through the first redistribution pattern 113 of the first redistribution structure 110. The footprint of the second redistribution structure 150 and the footprint of the first redistribution structure 110 may each be greater than a sum of the footprint of the first semiconductor chip 120 and a footprint of the second semiconductor chip 210. The second antenna pattern 155 may be formed in the second redistribution structure 150, and an antenna arrangement region in which the second antenna pattern 155 is arranged may be greater than a sum of the footprint of the first semiconductor chip 120 and the footprint of the second semiconductor chip 210.

The second BEOL structure 130 may include the reflective pattern 137 overlapping at least a portion of the second antenna pattern 155 in a plan view. The reflective pattern 137 may receive, for example, ground power supplied to the PMIC through the conductive post 143, the second redistribution pattern 153 of the second redistribution structure 150, and the second interconnect pattern 133 of the second BEOL structure 130.

Figure 10:
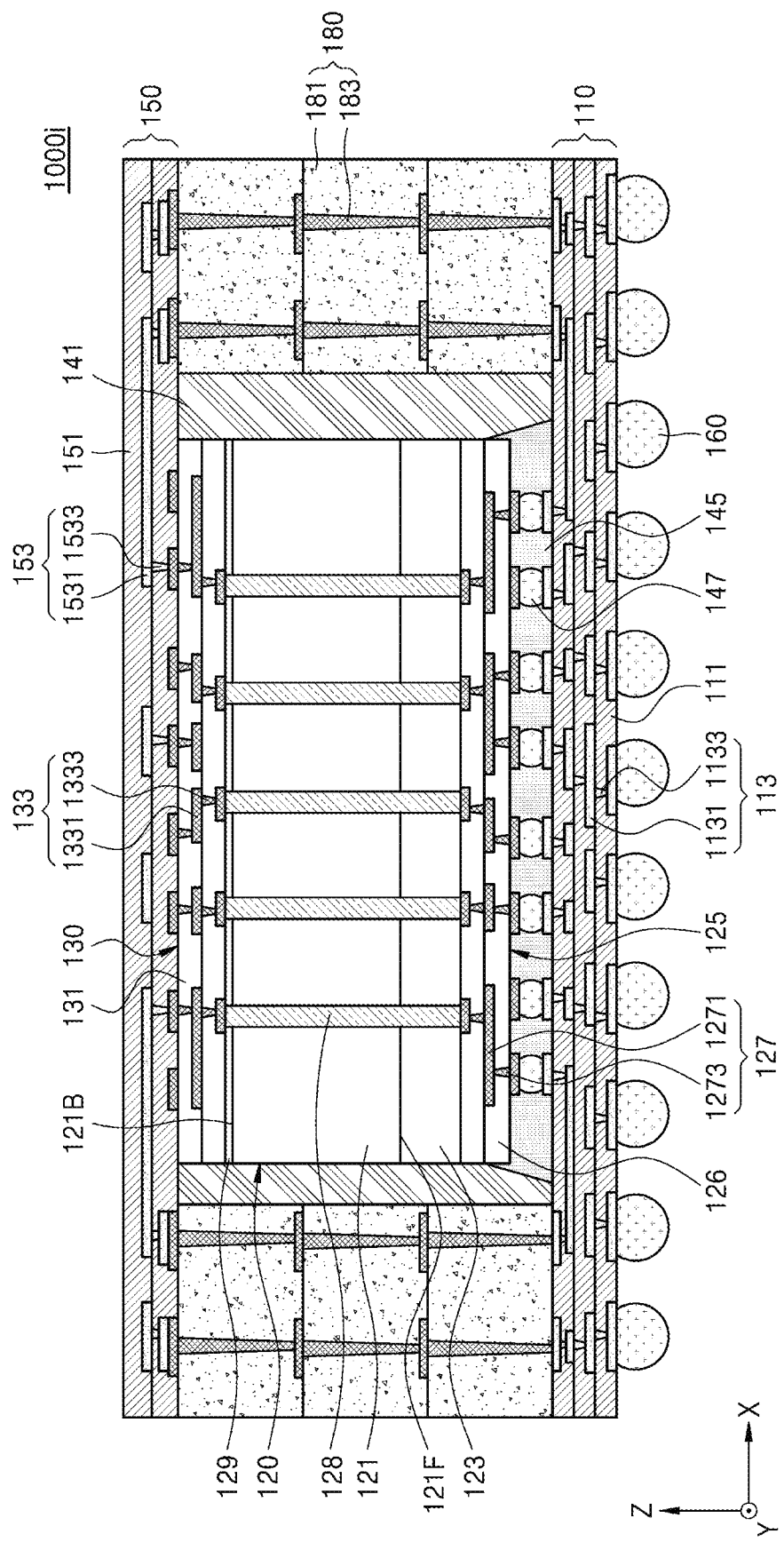
FIG. 10 is a cross-sectional view of a semiconductor package according to some example embodiments of the inventive concepts.

FIG. 10 is a cross-sectional view of a semiconductor package 1000i according to some example embodiments of the inventive concepts. Hereinafter, differences from the semiconductor package 1000 described with reference to FIG. 1 will be mainly described.

Referring to FIG. 10, the semiconductor package 1000i may be a fan-out panel level package. The semiconductor package 1000i may include a connection board 180 on the first redistribution structure 110. According to some example embodiments of the inventive concepts, the connection board 180 may include a cavity having a ring shape encompassing the sidewall of the first semiconductor chip 120 and capable of accommodating the first semiconductor chip 120 therein. The molding layer 141 may be filled between the sidewall of the first semiconductor chip 120 and the connection board 180 by being filled in the cavity of the connection board 180.

The connection board 180 may be, for example, a panel board, a printed circuit board, a ceramic board, and/or an interposer. For example, the connection board 180 may be a multi-layer printed circuit board. The connection board 180 may include a board base 181 and an interconnect pattern 183.

The board base 181 may include an electrically resistant material. For example, the board base 181 may include a phenol resin, an epoxy resin, and/or a polyimide. For example, the board base 181 may include at least of a glass-reinforced epoxy laminate material (like flame retardant 4 (FR-4)), a tetrafunctional epoxy, a polyphenylene ether, an epoxy/polyphenylene oxide, a bismaleimide triazine (BT), a non-woven aramid fabric (like thermount), a cyanate ester, a polyimide, and/or a liquid crystal polymer.

The interconnect pattern 183 may include conductive vias extending through the board base 181, and interconnect layers respectively connected to the conductive vias and extending along an upper and/or lower surface of the board base 181. Like the conductive post 143 of FIG. 1, the interconnect pattern 183 may include a vertical connection conductor electrically connecting the first redistribution pattern 113 of the first redistribution structure 110 to the second redistribution pattern 153 of the second redistribution structure 150.

FIGS. 11A to 11F are cross-sectional views for describing a method of fabricating a semiconductor chip included in a semiconductor package, according to some example embodiments of the inventive concepts. Hereinafter, a method of fabricating the semiconductor chip 120 in the semiconductor package 1000 will be described with reference to FIGS. 11A to 11F.

Figure 11A:
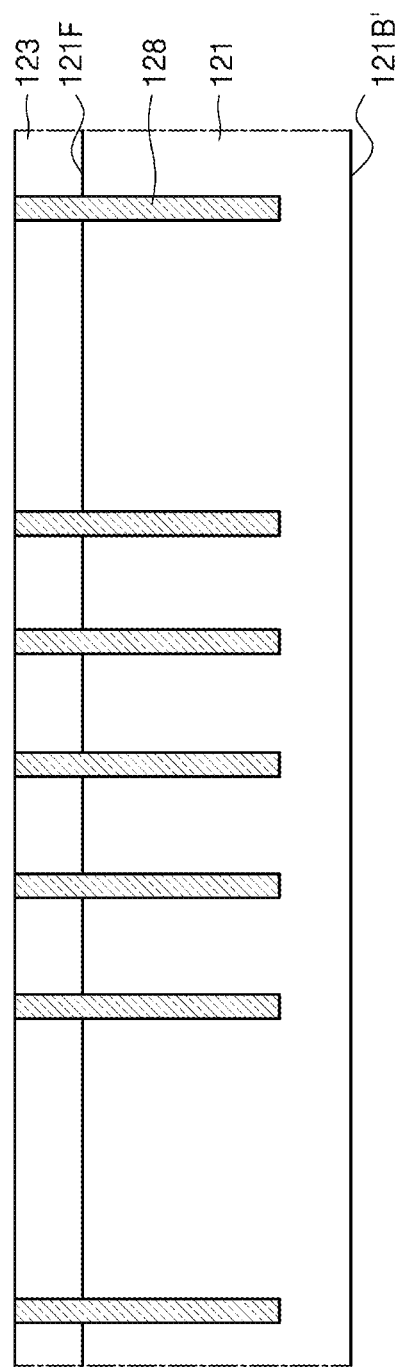
FIGS. 11A to 11F are cross-sectional views for describing a method of fabricating a semiconductor chip included in a semiconductor package, according to some example embodiments of the inventive concepts.

Referring to FIG. 11A, the semiconductor substrate 121, including the first surface 121F and a second surface 121B' that is opposite to the first surface 121F, is prepared, and the FEOL structure 123 is formed on the first surface 121F of the semiconductor substrate 121. The semiconductor substrate 121 may be, for example, a semiconductor wafer.

Thereafter, the through electrode 128 passing through the FEOL structure 123 and partially passing through the semiconductor substrate 121 is formed. The through electrode 128 extends from the first surface 121F of the semiconductor substrate 121 to the inside of the semiconductor substrate 121 and may have a pillar shape.

Figure 11B:
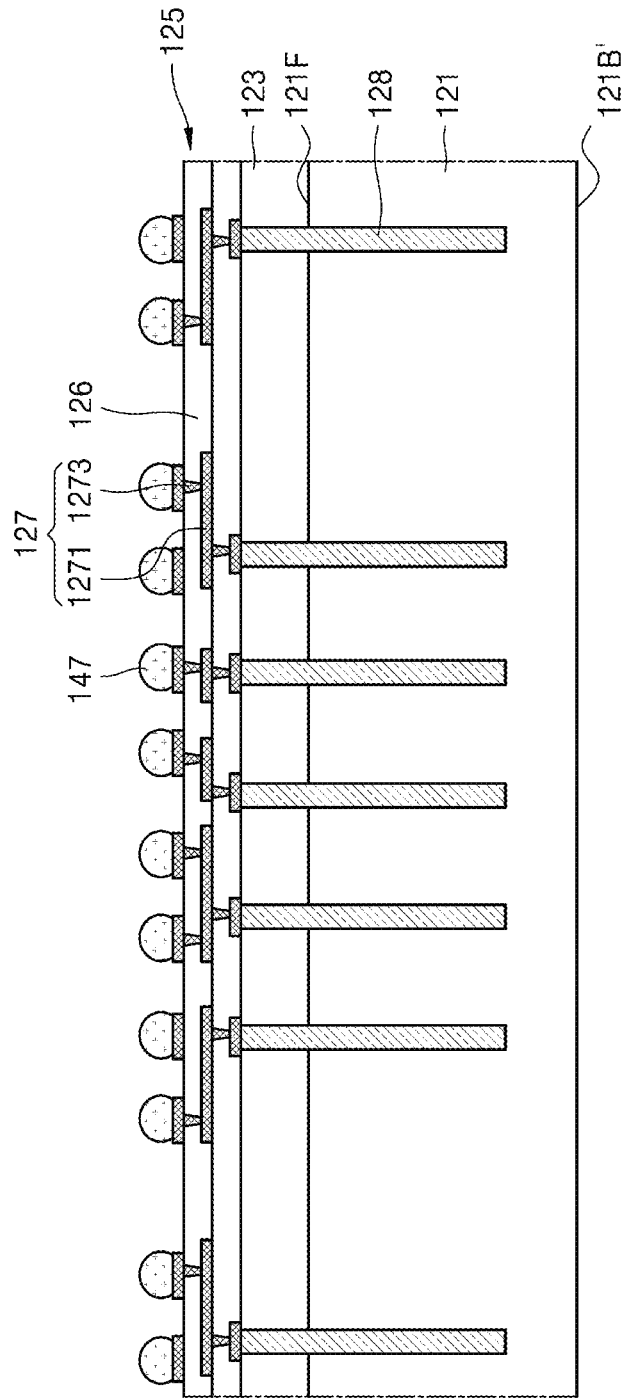

Referring to FIG. 11B, the first BEOL structure 125 is formed on the FEOL structure 123. The first BEOL structure 125 may include the plurality of first interlayer insulating layers 126 sequentially stacked on the FEOL structure 123, and the first interconnect pattern 127 insulated by the plurality of first interlayer insulating layers 126. To form the first BEOL structure 125, an operation of forming the first interlayer insulating layer 126 including a metal interconnect hole and an operation of forming a metal layer filling the metal interconnect hole of the first interlayer insulating layer 126 may be repeated several times. For example, the first BEOL structure 125 may be formed using a damascene process.

According to example embodiments of the inventive concepts, to form the first conductive via pattern 1273, a conductive material may be filled in a via hole in the first interlayer insulating layer 126. In this case, the via hole in the first interlayer insulating layer 126 may be formed by a reactive ion etching (RIE) process using plasma and/or a laser drilling process, and formed to have a tapered shape with a width gradually decreasing toward the first surface 121F of the semiconductor substrate 121. Because the first conductive via pattern 1273 is formed by filling the tapered-shaped via hole of the first interlayer insulating layer 126, the first conductive via pattern 1273 may have a tapered shape with a width gradually decreasing toward the first surface 121F of the semiconductor substrate 121.

After forming the first BEOL structure 125, the chip connection bump 147 is formed on the first conductive line pattern 1271 exposed to the outside.

Figure 11C:
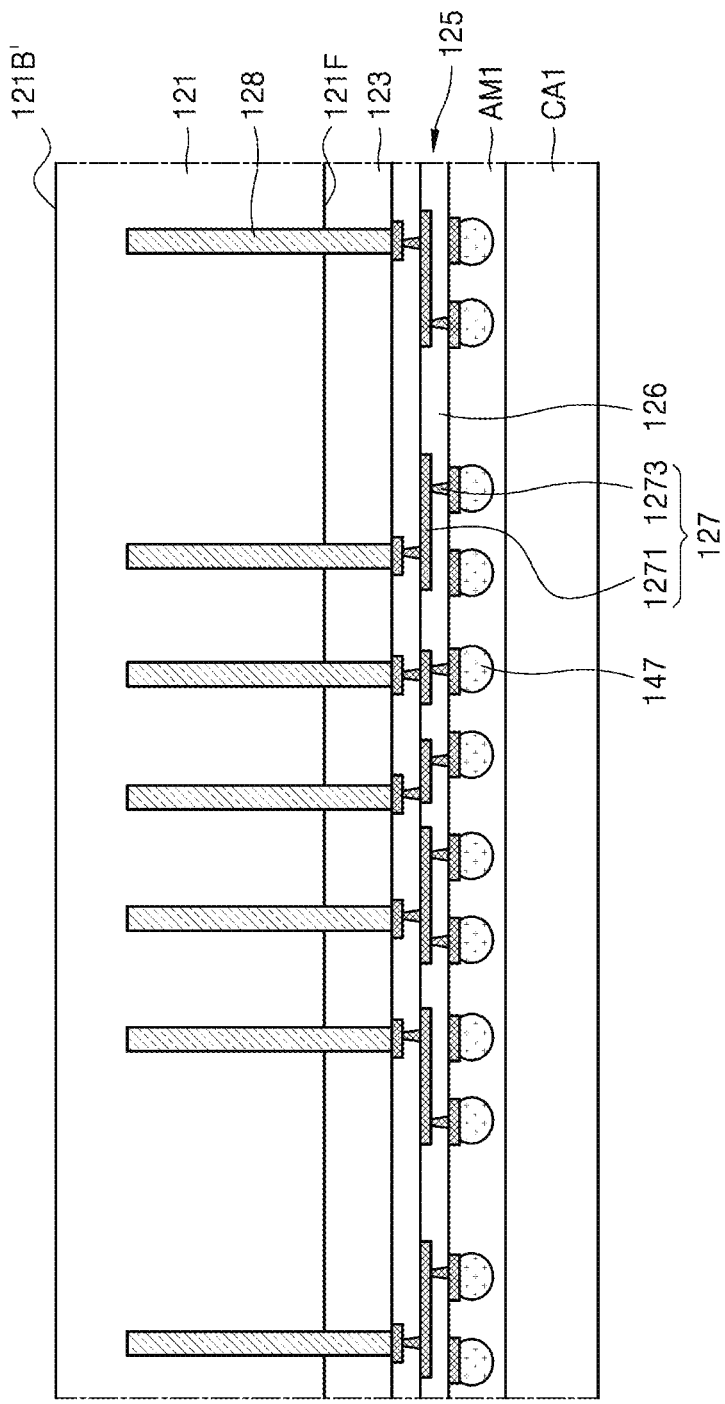

Referring to FIG. 11C, the result of FIG. 11B is turned over and attached to a first carrier board CA1. The first surface 121F of the semiconductor substrate 121 may face the first carrier board CA1, and the second surface 121B' of the semiconductor substrate 121 may be exposed. The first carrier board CA1 may include a first adhesive material layer AM1 attached to the result of FIG. 11B. The first adhesive material layer AM1 may include, for example, a release film.

Figure 11D:
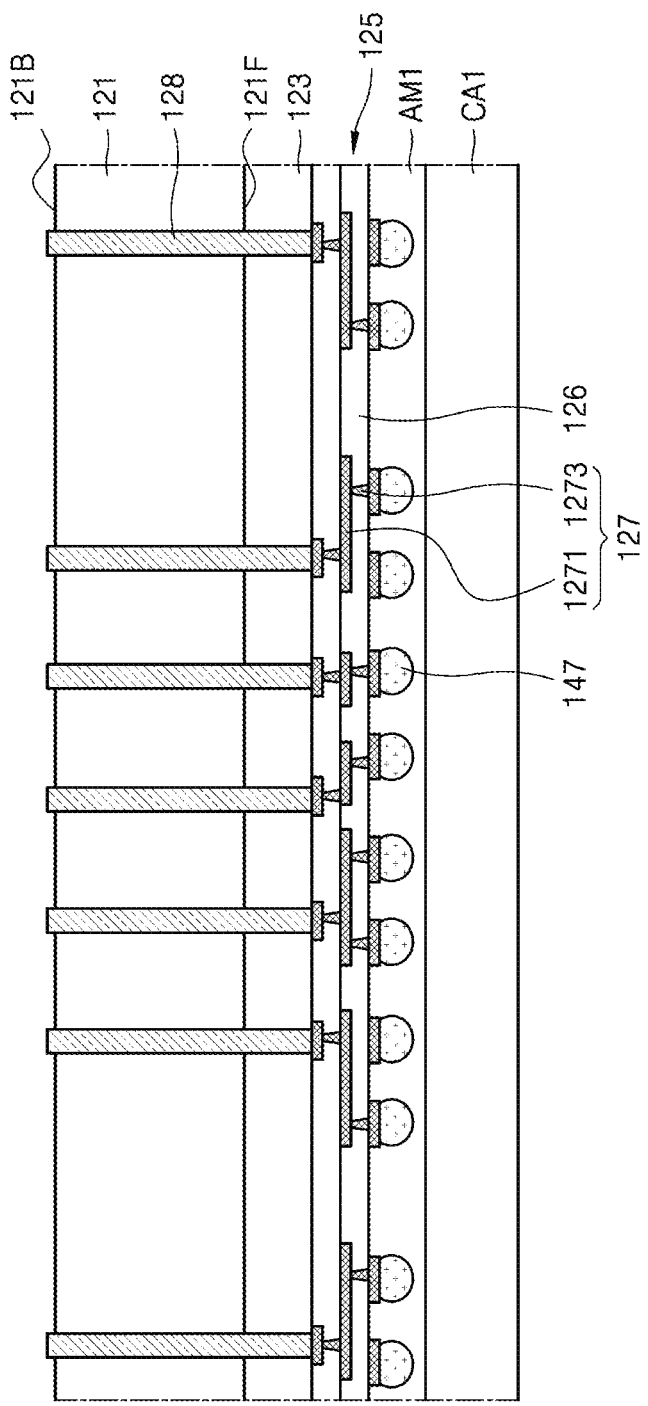

Referring to FIG. 11D, a portion of the through electrode 128 may be exposed by removing a portion of the semiconductor substrate 121. As a result of removing the portion of the semiconductor substrate 121, the through electrode 128 may have a shape passing through the semiconductor substrate 121. Selectively, as shown in FIG. 11D, the through electrode 128 may protrude from the second surface 121B of the semiconductor substrate 121.

To expose the through electrode 128, the portion of the semiconductor substrate 121 may be removed using a chemical mechanical polishing (CMP) process, an etch-back process, and/or a combination thereof.

Figure 11E:
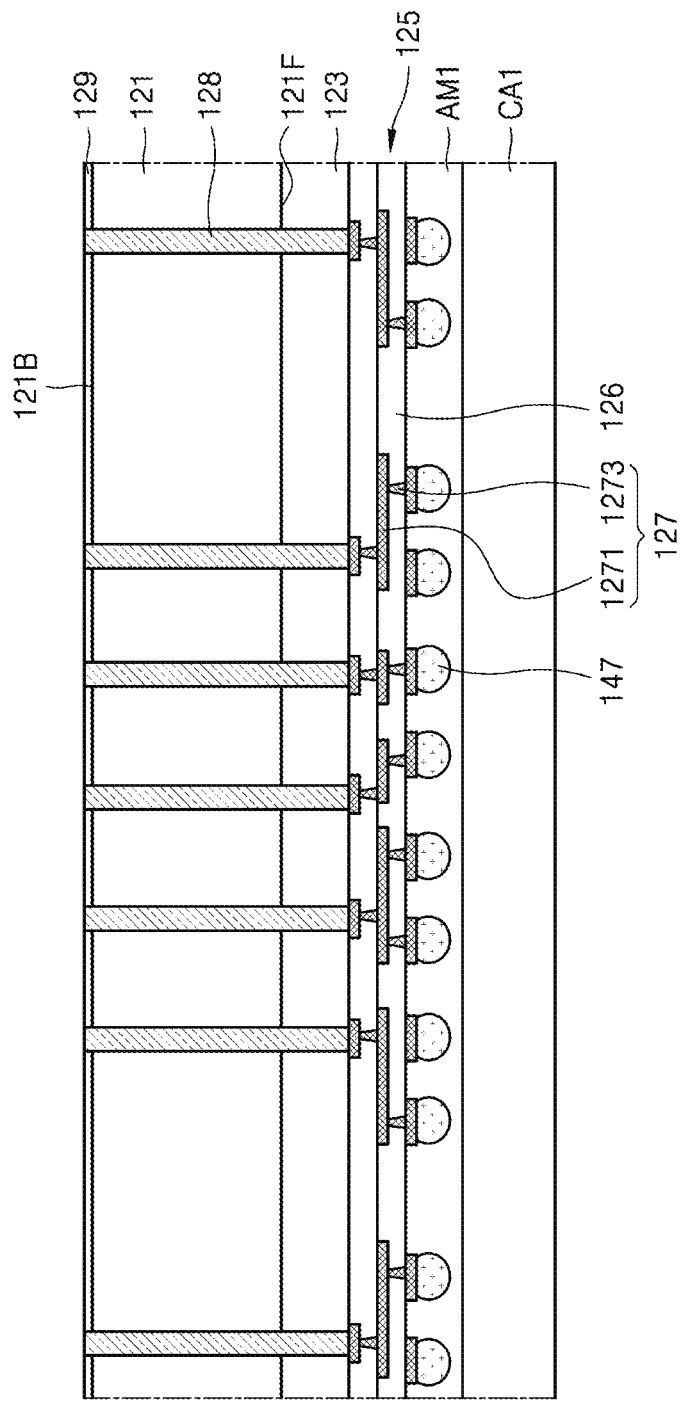

Referring to FIG. 11E, a passivation layer 129 covering the second surface 121B of the semiconductor substrate 121 is formed. The passivation layer 129 may be formed using, for example, a spin coating process and/or a spray process. The passivation layer 129 may be formed of, for example, an insulating polymer. To form the passivation layer 129, an insulating polymer layer covering the second surface 121B of the semiconductor substrate 121 and the exposed through electrode 128 may be formed, and the through electrode 128 may be exposed by removing a portion of the insulating polymer layer. For example, the portion of the insulating polymer layer may be removed using an etch-back process.

Figure 11F:
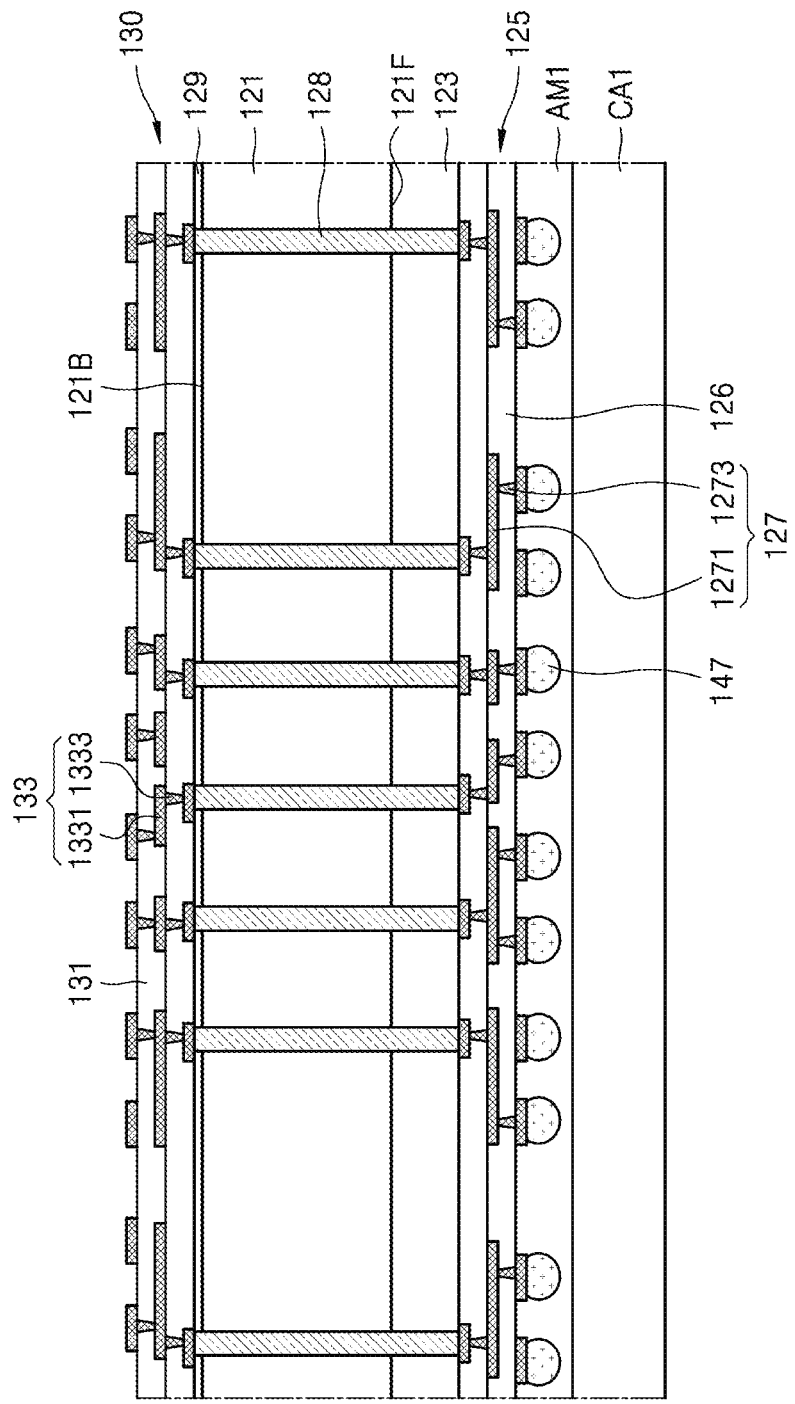

Referring to FIG. 11F, after forming the passivation layer 129, the second BEOL structure 130 is formed on the passivation layer 129.

The second BEOL structure 130 may include the plurality of second interlayer insulating layers 131 sequentially stacked on the second surface 121B of the semiconductor substrate 121, and the second interconnect pattern 133 insulated by the plurality of second interlayer insulating layers 131. To form the second BEOL structure 130, an operation of forming the second interlayer insulating layer 131 including a metal interconnect hole and an operation of forming a metal layer filling the metal interconnect hole of the second interlayer insulating layer 131 may be repeated several times. For example, the second BEOL structure 130 may be formed using a damascene process.

According to some example embodiments of the inventive concepts, to form the second conductive via pattern 1333, a conductive material may be filled in a via hole in the second interlayer insulating layer 131. In this case, the via hole in the second interlayer insulating layer 131 may be formed by an RIE process using plasma and/or a laser drilling process, and formed to have a tapered shape with a width gradually decreasing toward the second surface 121B of the semiconductor substrate 121. Because the second conductive via pattern 1333 is formed by filling the tapered-shaped via hole of the second interlayer insulating layer 131, the second conductive via pattern 1333 may have a tapered shape with a width gradually decreasing toward the second surface 121B of the semiconductor substrate 121.

After forming the second BEOL structure 130, a chip separation process (like a sawing process of cutting the result shown in FIG. 11F) may be performed along a scribe lane (not illustrated) of the semiconductor substrate 121. After performing the chip separation process, the first carrier board CA1 may be removed. Through the chip separation process, the result of FIG. 11F may be divided into a plurality of first semiconductor chips (120 of FIG. 1).

FIGS. 12A to 12E are cross-sectional views for describing a method of manufacturing a semiconductor package, according to some example embodiments of the inventive concepts. Hereinafter, a method of manufacturing the semiconductor package 1000 shown in FIG. 1 will be described with reference to FIGS. 12A to 12E.

Figure 12A:
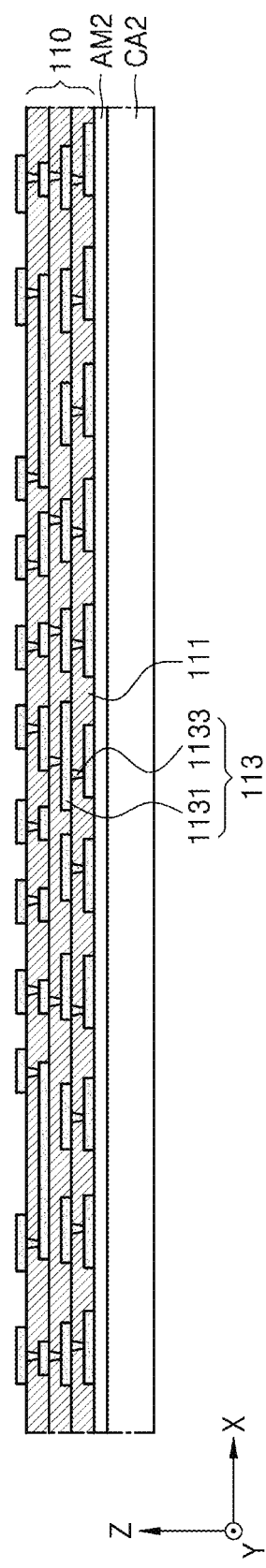

Referring to FIG. 12A, the first redistribution structure 110 is formed on a second carrier board CA2. The second carrier board CA2 may include a second adhesive material layer AM2 such as a release film on one surface thereof. For example, the second adhesive material layer AM2 may be between the second carrier board CA2 and the first redistribution structure 110.

The first redistribution structure 110 may include the plurality of first redistribution insulating layers 111 sequentially stacked on the second carrier board CA2, and the first redistribution pattern 113 insulated by the plurality of first redistribution insulating layers 111. To form the first redistribution structure 110, a first operation of forming a conductive material layer on the second carrier board CA2 and patterning the conductive material layer to form a first layer of the first redistribution line pattern 1131, a second operation of forming the first redistribution insulating layer 111 covering the first layer of the first redistribution line pattern 1131 and having a via hole, and a third operation of forming the first redistribution via pattern 1133 filling the via hole of the first redistribution insulating layer 111 and the first redistribution line pattern 1131 extending along an upper surface of the first redistribution insulating layer 111 may be performed, and then, the second and third operations may be repeated several times.

Figure 12B:
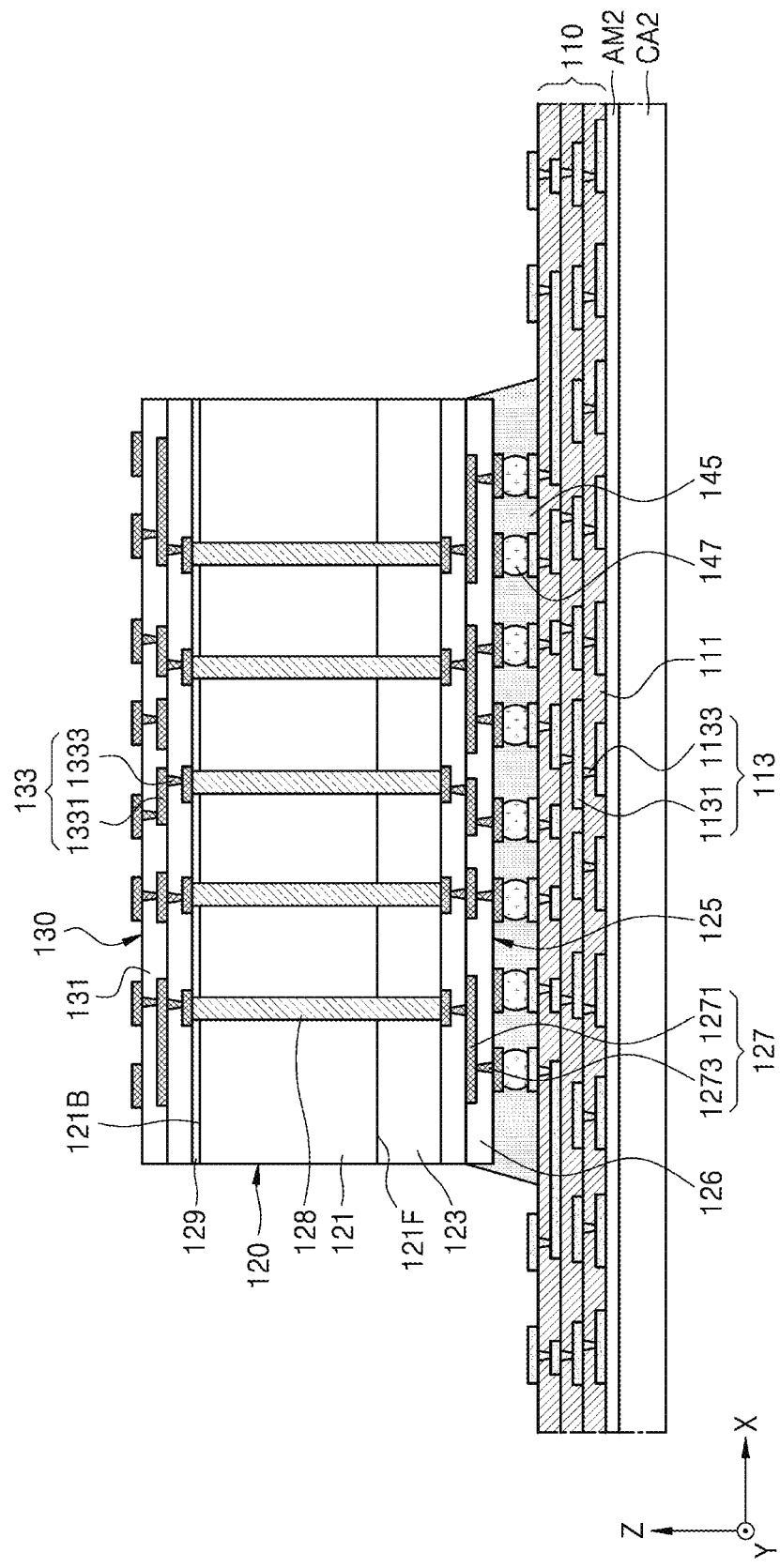

Referring to FIG. 12B, the first semiconductor chip 120 is attached onto the first redistribution structure 110. The first semiconductor chip 120 may be attached onto the first redistribution structure 110 so that the first BEOL structure 125 faces the first redistribution structure 110. For example, the first semiconductor chip 120 may be mounted on the first redistribution structure 110 in a flip-chip manner. The attachment of the first semiconductor chip 120 to the first redistribution structure 110 may include the formation of the chip connection bumps 147, for example, by fixing a solder ball and/or bump between an upper first redistribution line pattern 1131 and a lower first conductive line pattern 1271.

After attaching the first semiconductor chip 120 onto the first redistribution structure 110, the underfill material layer 145 filling a space between the first semiconductor chip 120 and the first redistribution structure 110 is formed. The underfill material layer 145 may encompass the chip connection bump 147. For example, the underfill material layer 145 may be formed by a capillary underfill method after attaching the first semiconductor chip 120 onto the first redistribution structure 110. According to some example embodiments of the inventive concepts, the underfill material layer 145 may be formed by attaching a non-conductive film on a lower surface of the first semiconductor chip 120 and then attaching the first semiconductor chip 120 onto the first redistribution structure 110.

Figure 12C:
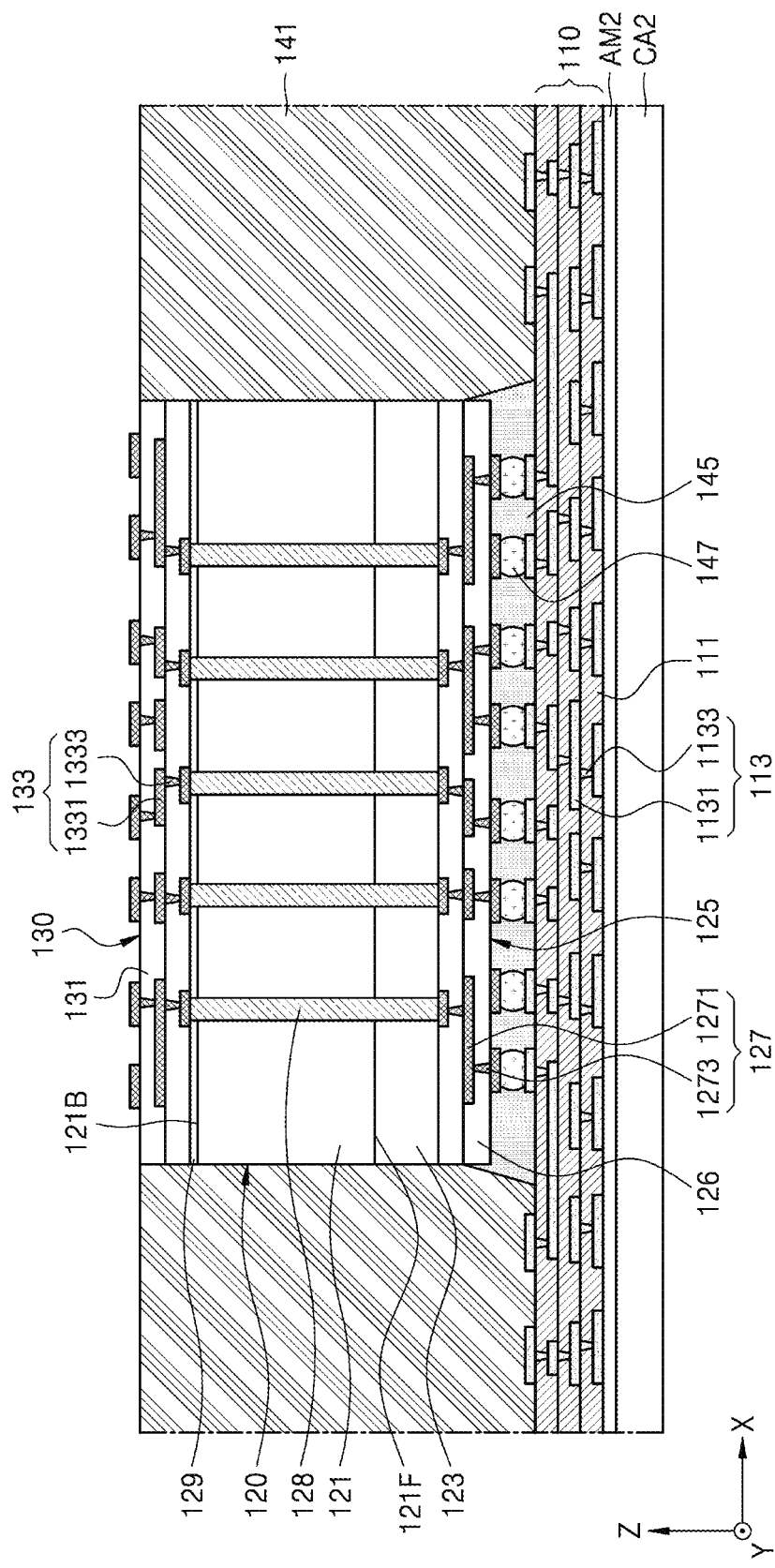

Referring to FIG. 12C, after forming the underfill material layer 145, the molding layer 141 molding the first semiconductor chip 120 is formed. The molding layer 141 may cover the sidewall of the first semiconductor chip 120 and expose the upper surface of the first semiconductor chip 120. In addition, the molding layer 141 may cover a portion of the upper surface of the first redistribution structure 110. According to other example embodiments of the inventive concepts, the molding layer 141 may be formed to further cover the upper surface of the first semiconductor chip 120.

Referring to FIG. 12D, after forming the molding layer 141, the conductive post 143 connected to the first redistribution pattern 113 of the first redistribution structure 110 by passing through the molding layer 141 is formed. For example, the conductive post 143 may be formed by forming a hole through the molding layer 141 and filling the hole with a conductive material.

Figure 12E:
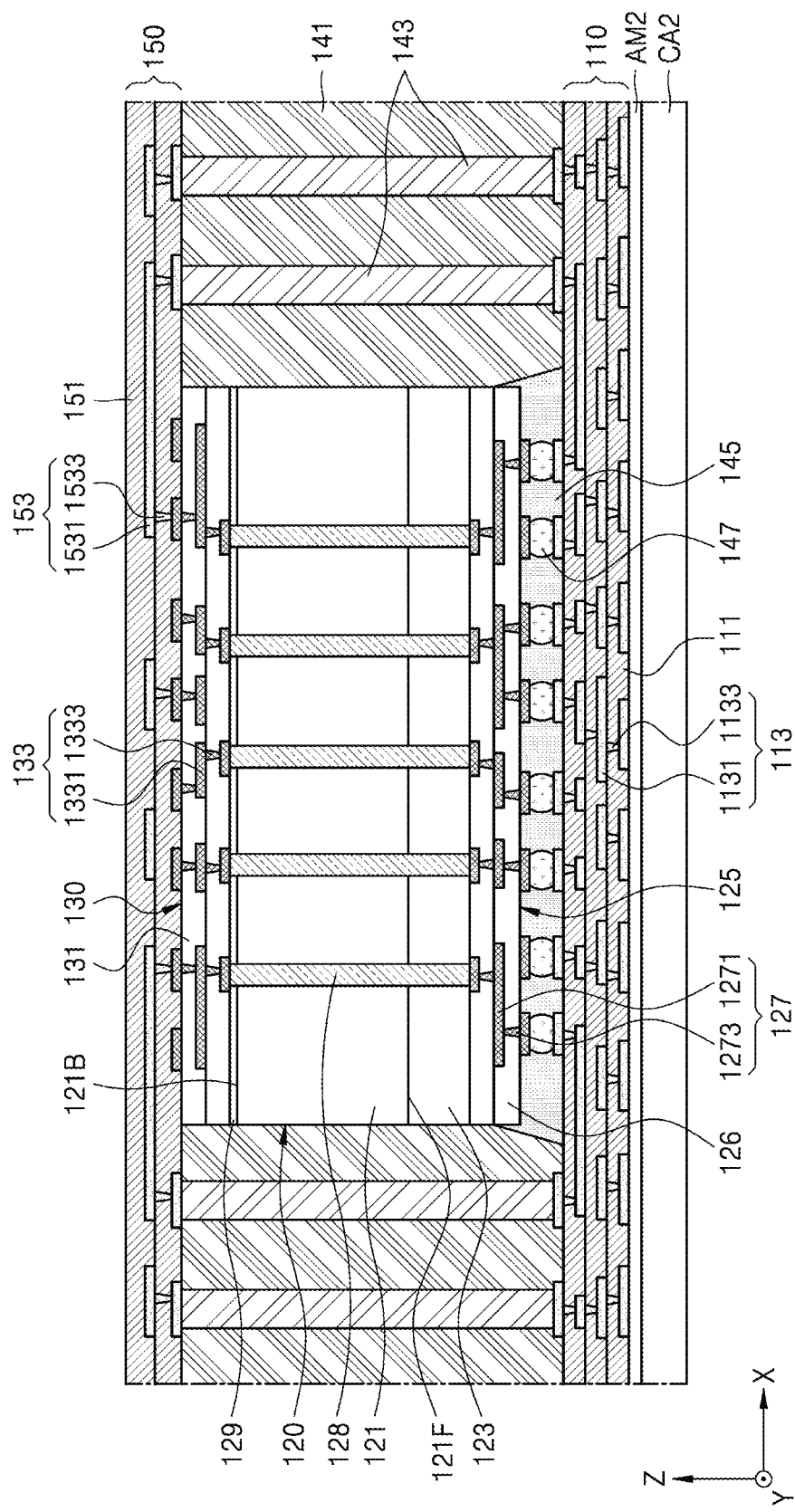

Referring to FIG. 12E, after forming the conductive post 143, the second redistribution structure 150 is formed on the molding layer 141 and the first semiconductor chip 120.

The second redistribution structure 150 may include the plurality of second redistribution insulating layers 151 sequentially stacked on the upper surface of the molding layer 141 and the upper surface of the first semiconductor chip 120, and the second redistribution pattern 153 insulated by the plurality of second redistribution insulating layers 151. To form the second redistribution structure 150, a first operation of forming a conductive material layer on the upper surface of the molding layer 141 and the upper surface of the first semiconductor chip 120 and patterning the conductive material layer to form a first layer of the second redistribution line pattern 1531 connected to the conductive post 143, a second operation of forming the second redistribution insulating layer 151 covering the first layer of the second redistribution line pattern 1531 and having a via hole, a third operation of forming the second redistribution via pattern 1533 filling the via hole of the second redistribution insulating layer 151 and a second layer of the second redistribution line pattern 1531 extending along an upper surface of the second redistribution insulating layer 151, and a fourth operation of forming the second redistribution insulating layer 151 covering the second layer of the second redistribution line pattern 1531 may be sequentially performed.

After forming the second redistribution structure 150, a package separation process (like a sawing process of cutting the result shown in FIG. 12E) may be performed. After performing the package separation process, the second carrier board CA2 may be removed. Through the package separation process, the result of FIG. 12E may be divided into a plurality of first semiconductor packages.

Although a manufacturing method of a chip-last scheme of arranging the first semiconductor chip 120 after forming the first redistribution structure 110 has been described with reference to FIGS. 12A to 12E, a semiconductor package may be manufactured in a chip-first scheme of sequentially forming a molding layer molding the first semiconductor chip 120, forming the first redistribution structure 110, and forming the second redistribution structure 150. In the chip-first scheme, the chip connection bump 147 and the underfill material layer 145 may be omitted, and the first semiconductor chip 120 may be directly connected to the first redistribution structure 110.

According to some example embodiments of the inventive concepts, because the second BEOL structure 130 on the back side of the first semiconductor chip 120 includes a signal routing path, a power distribution network, an antenna pattern, and the like, a degree of freedom of an interconnect design may be increased, and miniaturization of a semiconductor package may be achieved.

While the inventive concepts have been particularly shown and described with reference to embodiments thereof, it will be understood that various changes in form and details may be made therein without departing from the spirit and scope of the following claims.

What is claimed is:

1. A semiconductor package comprising:
 a first substrate comprising a first conductive pattern;
 a first semiconductor chip on the first substrate; and
 an upper structure on the first semiconductor chip such that the first semiconductor chip is between the upper structure and the first substrate, the upper structure including an insulating layer and a second conductive pattern in the insulating layer,
 wherein the first semiconductor chip comprises
  a semiconductor substrate,
  a first back end of line (BEOL) structure on a first surface of the semiconductor substrate, the first BEOL structure comprising a first interconnect pattern, and
  a second BEOL structure on a second surface of the semiconductor substrate, the second BEOL structure comprising a second interconnect pattern and a first antenna pattern configured to transmit and receive a radio signal, and
 the second conductive pattern is electrically connected to the first antenna pattern.

2. The semiconductor package of claim 1, further comprising:
 a molding layer covering a sidewall of the first semiconductor chip;
 and
 a conductive post passing through the molding layer and electrically connecting the first conductive pattern to the second conductive pattern.

3. The semiconductor package of claim 2, wherein
 the second BEOL structure further comprises an electrically grounded reflective pattern,
 the electrically grounded reflective pattern overlaps the first antenna pattern in a plan view, and
 the electrically grounded reflective pattern, the first antenna pattern, and the second interconnect pattern include the same material.

4. The semiconductor package of claim 3, wherein the electrically grounded reflective pattern is configured to receive a ground voltage through an electrical path including an external connection terminal, the first conductive pattern, the conductive post, and the second conductive pattern.

5. The semiconductor package of claim 2, wherein the upper structure further comprising a second antenna pattern on the insulating layer and configured to transmit and receive a radio signal.

6. The semiconductor package of claim 1, further comprising:
 a second semiconductor chip on the first substrate and spaced apart from the first semiconductor chip, wherein:
 the first semiconductor chip comprises a radio-frequency integrated circuit (RFIC), and
 the second semiconductor chip comprises a power management integrated circuit (PMIC).

7. The semiconductor package of claim 1, wherein the first semiconductor chip further comprises a through electrode passing through the semiconductor substrate and electrically connecting the first interconnect pattern to the second interconnect pattern.

8. The semiconductor package of claim 1, wherein the first antenna pattern comprises a patch antenna.

9. The semiconductor package of claim 1, wherein a footprint of the second BEOL structure is the same as a footprint of the semiconductor substrate and smaller than a footprint of the first substrate.

10. The semiconductor package of claim 1, wherein the first semiconductor chip further comprises a front end of line (FEOL) structure between the semiconductor substrate and the first BEOL structure, the FEOL structure comprising a plurality of individual devices.

11. The semiconductor package of claim 1, wherein the first semiconductor chip is mounted on the first substrate by chip connection bumps.

12. A semiconductor package comprising:
 a first substrate comprising a first conductive pattern;
 a first semiconductor chip on the first substrate, the first semiconductor chip comprising
  a semiconductor substrate,
  a first back end of line (BEOL) structure on a first surface of the semiconductor substrate, the first BEOL structure comprising a first interconnect pattern, and
  a second BEOL structure on a second surface of the semiconductor substrate, the second BEOL structure comprising a second interconnect pattern;
 a molding layer contacting a sidewall of the first semiconductor chip;
 an upper structure on the molding layer and the first semiconductor chip, the upper structure including an insulating layer and a second conductive pattern in the insulating layer;
 an antenna pattern between the insulating layer and the second BEOL structure, the antenna pattern configured to transmit and receive a radio signal;
 and a conductive post passing through the molding layer and electrically connecting the first conductive pattern to the second conductive pattern.

13. The semiconductor package of claim 12, wherein the second BEOL structure further comprises an electrically grounded reflective pattern between the semiconductor substrate and the antenna pattern.

14. The semiconductor package of claim 13, wherein the electrically grounded reflective pattern is configured to receive a ground voltage through an electrical path including the first conductive pattern, the conductive post, and the second conductive pattern.

15. The semiconductor package of claim 12, wherein
the first semiconductor chip further comprises a front end of line (FEOL) structure between the semiconductor substrate and the first BEOL structure, the FEOL structure comprising a plurality of individual devices, and
the molding layer extends along a sidewall of the second BEOL structure, a sidewall of the FEOL structure, the sidewall of the semiconductor substrate, and a sidewall of the first BEOL structure.

16. The semiconductor package of claim 12, wherein the first semiconductor chip further comprises a through electrode passing through the semiconductor substrate and electrically connecting the first interconnect pattern to the second interconnect pattern.

17. The semiconductor package of claim 12, wherein the antenna pattern comprises a patch antenna.

18. The semiconductor package of claim 12, wherein
a footprint of the first substrate is greater than a footprint of the first semiconductor chip, and
a footprint of the first BEOL structure, a footprint of the second BEOL structure, and a footprint of the semiconductor substrate are the same each other.

19. The semiconductor package of claim 12, further comprising:
a second semiconductor chip on the first substrate and spaced apart from the first semiconductor chip, wherein:
the first semiconductor chip comprises a radio-frequency integrated circuit (RFIC),
the second semiconductor chip comprises a power management integrated circuit (PMIC), and
the conductive post is between the first semiconductor chip and the second semiconductor chip.

20. A semiconductor package comprising:
a first substrate comprising a first conductive pattern;
a first semiconductor chip on the first substrate, the first semiconductor chip comprising a semiconductor substrate, a first back end of line (BEOL) structure on a first surface of the semiconductor substrate, the first BEOL structure comprising a first interconnect pattern, and a second BEOL structure on a second surface of the semiconductor substrate, the second BEOL structure comprising a second interconnect pattern;
a molding layer contacting a sidewall of the first semiconductor chip;
an insulating layer on the molding layer and the first semiconductor chip;
an antenna pattern in the insulating layer and configured to transmit and receive a radio signal;
a second conductive pattern in the insulating layer; and
a conductive post passing through the molding layer and electrically connecting the first conductive pattern to the second conductive pattern, wherein the antenna pattern is electrically connected to the first semiconductor chip through an electrical path including the first conductive pattern, the conductive post, and the second conductive pattern.

* * * * *